US005936844A

United States Patent [19]

Walton

[11] Patent Number: 5,936,844

[45] Date of Patent: Aug. 10, 1999

[54] MEMORY SYSTEM PRINTED CIRCUIT BOARD

[75] Inventor: John K. Walton, Mendon, Mass.

[73] Assignee: EMC Corporation, Hopkinton, Mass.

[21] Appl. No.: 09/052,263

[22] Filed: Mar. 31, 1998

[51] Int. Cl.[6] .............................. H05K 1/14; H01L 27/00

[52] U.S. Cl. .......................... 361/760; 361/772; 361/783; 361/728; 361/765; 361/736; 361/767; 361/807; 361/808; 257/698; 257/690; 257/774; 257/782; 257/692; 257/773; 228/180.21; 228/179.1; 439/69

[58] Field of Search .................................... 361/760, 772, 361/783, 728, 765, 736, 764, 787, 807, 808; 257/684, 682, 687, 698, 690, 773, 774, 782, 787, 692, 678; 228/180.21, 179.1; 439/69

[56] References Cited

U.S. PATENT DOCUMENTS

| | | | |
|---|---|---|---|
| 4,761,881 | 8/1988 | Bora et al. | 29/840 |
| 5,420,751 | 5/1995 | Burns | 361/707 |
| 5,661,339 | 8/1997 | Clayton | 257/678 |
| 5,754,408 | 5/1998 | Derouiche | 361/773 |

*Primary Examiner*—Leo P. Picard
*Assistant Examiner*—David Foster
*Attorney, Agent, or Firm*—Fish & Richardson P.C.

[57] ABSTRACT

A memory system printed circuit board having an array of memory units disposed on a surface of the printed circuit board. The memory units are arranged in a matrix of row and columns. A first pair of elongated electrical conductor is disposed on an inner portion of the printed circuit board. Each one of the electrical conductors has disposed along a length thereof a plurality of laterally displaced legs. Each one of the legs has a proximal end extending from the conductor. A plurality of conductive vias pass through the printed circuit board, each one of such vias having one end thereof in contact with a one of the legs and a second end at the surface of the printed circuit board for electrical connection to a corresponding one of the rows of memory units. An array of electrical contact pads disposed on a surface of the printed circuit board and arranged for connection to balls of a ball grid array package, such pads being arranged in rows. A second pair of the electrical conductors electrically connected to corresponding alternating ones of rows of the pads through a corresponding one of a pair of second conductive vias, each one the conductors in the second pair thereof being electrically connected to a corresponding one of the conductors in the first pair thereof. Contact pads are disposed between the alternating ones of the rows are electrically isolated from said pair of electrical conductors.

13 Claims, 15 Drawing Sheets

TO/FROM RAM REGION A
CONTROL/PORT SELECT/PORT ERROR
20
A BUS
TO/FROM MEMORY REGION A
DATA/CHIP SELECT/ READ/WRITE
80
40
40
159A
SELECT
159B
SELECT
TMR CHIP SELECT/ READ-WRITE
"O"
13
40
40
40
9
9
9
27
80
DATA
BUS ARBITRATION
CONTROL LOGIC
157
DECODER
BUFFER MEMORY
EDAC
(FIG. 9)
155
153
150
152
ASIC (A, A)

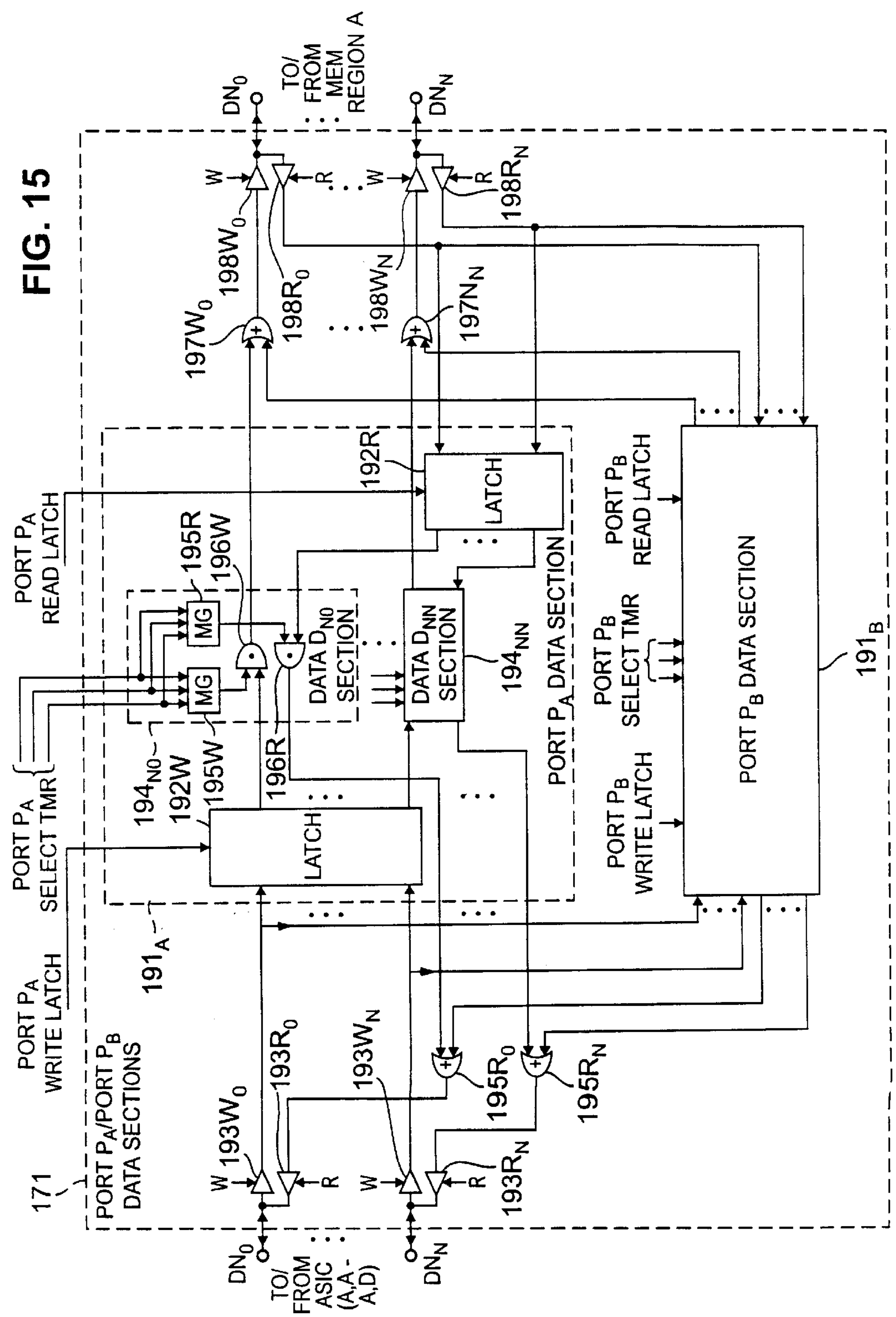
FIG. 15
$DN_0$
TO/ FROM MEM REGION A
$DN_N$
W
R
$198W_0$
$198R_0$
$198W_N$
$198R_N$
$197W_0$
$197N_N$
192R
LATCH
PORT $P_A$ READ LATCH
195R
196W
MG
MG
DATA $D_{N0}$ SECTION
DATA $D_{NN}$ SECTION
$194_{NN}$
PORT $P_A$ DATA SECTION
PORT $P_B$ READ LATCH
PORT $P_B$ SELECT TMR
PORT $P_B$ WRITE LATCH
PORT $P_B$ DATA SECTION
$191_B$
PORT $P_A$ SELECT TMR
$194_{N0}$
192W
195W
196R
LATCH
PORT $P_A$ WRITE LATCH
$191_A$
PORT $P_A$/PORT $P_B$ DATA SECTIONS
171
$193W_0$
$193R_0$
$193W_N$
$193R_N$
$195R_0$
$195R_N$
$DN_0$
TO/ FROM ASIC (A,A - A,D)
$DN_N$

MEMORY SYSTEM PRINTED CIRCUIT BOARD

BACKGROUND OF THE INVENTION

This invention relates generally to memory systems and more particularly to fault tolerant memory systems.

As is known in the art, in many applications a memory board is arranged as shown in FIG. 1. Thus, such memory board includes a plurality of memory banks $\mathbf{10}_1$–$\mathbf{10}_n$. Each one of the memory banks $\mathbf{10}_1$–$\mathbf{10}_n$ has a plurality of random access memories (RAMs), here for example, dynamic RAMs (DRAMs) $\mathbf{12}_0$–$\mathbf{12}_m$. Each bit of a data word on a corresponding one of lines $D_0$–$D_m$ is coupled to the data bit terminal, D, of a corresponding one of the DRAMs $\mathbf{12}_1$–$\mathbf{12}_n$ in each one of the memory banks $\mathbf{10}_1$–$\mathbf{10}_n$. Thus, for example, data bit $D_0$ of the data word is coupled to the data bit terminal, D, of the DRAMs $\mathbf{12}_0$ in each of the memory banks $\mathbf{10}_1$–$\mathbf{10}_n$. Each data word includes, in addition to data, a plurality of bits for error detection and correction. For example, a Solomon-Reed code. Thus, for example, if the data portion of the data word includes 64 bits (i.e., 8 bytes), an additional byte (i.e., 8 bits) is included in the data word for error correction and detection. Thus, in this example m=71 and there are 72 DRAMs $\mathbf{12}_0$–$\mathbf{12}_{71}$ in each one of the memory banks $\mathbf{10}_1$–$\mathbf{10}_n$.

Each DRAM is addressable by an r bit address, $A_0$–$A_{(r-1)}$. Consider, for example the case where r=12. Thus, a 12 bit row address and a 12 bit column address are fed sequentially to the address terminals, A, of the DRAMs. More particularly, when the 12 bit row address is fed to the DRAM, a control signal is also fed to a column address select line (CAS) of the DRAM. Likewise, when the 12 bit row address is fed to the DRAM, a control signal is fed to the row address select line (RAS) for the DRAM. The read/write mode of the DRAMs is selected by a control signal on write line (WR). Thus, here each DRAM has 16 megabits of addressable locations and, therefore, each memory bank is able to store 16 megabits of 9 byte digital words; 8 bytes of data and a byte for error detection and correction.

It is noted that the address signals are fed to the memory board by a logic network, not shown. In order to provide adequate power to address large numbers of DRAMs, drivers 14 are included. Typically, each driver 14 is adapted to drive about 18–36 DRAMS. Thus, assuming here that each driver 14 is used to drive 36 DRAMs, there are 2 drivers 14 for each one of the memory banks $\mathbf{10}_1$–$\mathbf{10}_n$.

Finally, as mentioned above, the EDAC may be performed on the data by checking the data read from the memory using a Solomon-Reed code, for example. However, a failure in one of the drivers 14 results in the 36 bits of data being written to an incorrect memory location. While parity checking of the address may be used to detect the presence of an error in the address, an EDAC will not be able to readily correct 36 bits of data which have become stored in the incorrect address location.

One arrangement which solves this problem is described in U.S. Pat. No. 5,577,004 entitled "Memory System and Method", issued Nov. 19, 1996, inventor Eli Leshem, assigned to the same assignee as the present invention. As descried therein, a memory system 20 (FIG. 2) has a plurality of, here p, memory banks $\mathbf{22}_1$–$\mathbf{22}_p$. Each one of the memory banks $\mathbf{22}_1$–$\mathbf{22}_p$ includes a plurality of, here m+1, memory units, here DRAMs $\mathbf{24}_0$–$\mathbf{24}_m$. Each one of the DRAMs $\mathbf{24}_0$–$\mathbf{24}_m$ has a set of address terminals, A, a data terminal, D, a column address select (CAS), a row address select (RAS) and a write enable (WR).

The memory 20 includes a plurality of, here m+1, drivers $\mathbf{26}_0$–$\mathbf{26}_m$. Each one of the drivers $\mathbf{26}_0$–$\mathbf{26}_m$ is coupled to the set of address terminals, A, of a corresponding one of the DRAMs $\mathbf{24}_0$–$\mathbf{24}_m$ in each one of the memory banks $\mathbf{22}_1$–$\mathbf{22}_p$. Thus, for example, driver $\mathbf{26}_1$ is coupled to DRAMs $\mathbf{24}_1$ in each of the memory banks $\mathbf{22}_1$–$\mathbf{22}_p$. Likewise, for example, driver $\mathbf{26}_m$ is coupled to DRAMs $\mathbf{24}_m$ in each of the memory banks $\mathbf{22}_1$–$\mathbf{22}_p$.

Each one of the DRAMs $\mathbf{24}_0$–$\mathbf{24}_m$ in each of the memory banks $\mathbf{22}_1$–$\mathbf{22}_p$ include a data terminal, D. The data terminal, D, of one of the DRAMs $\mathbf{24}_0$–$\mathbf{24}_m$, in each one of the memory banks $\mathbf{22}_1$–$\mathbf{22}_p$ is coupled to a corresponding one bit line of an m+1 bit line data bus, DB. Thus, here the data bus DB has m+1 bit lines $D_m$–$D_0$, as shown. Therefore, the data terminal, D, of DRAMs 241, for example, in each one of the memory banks $\mathbf{22}_1$–$\mathbf{22}_p$ is coupled to bit line $D_1$ of the data bus DB. Likewise, the data terminal, D, of DRAMs $\mathbf{24}_m$, for example, in each one of the memory banks $\mathbf{22}_1$–$\mathbf{22}_p$ is coupled to bit line $D_m$ of the data bus DB.

An r bit address signal, $A_0$–$A_{r-1}$, from an address/control logic 27, is fed to drivers $\mathbf{26}_0$–$\mathbf{26}_m$ via an r+2 bit address bus 28, as shown. Each one of the drivers $\mathbf{26}_0$–$\mathbf{26}_m$ is coupled to the set of address terminals A of a corresponding one of the DRAMs $\mathbf{24}_0$–$\mathbf{24}_p$, respectively, in each of the memory banks $\mathbf{22}_1$–$\mathbf{22}_p$, as shown. Thus, for example, the r bit output of driver $\mathbf{26}_1$ is coupled to the r bit set of address terminals, A, of DRAMs $\mathbf{24}_1$ in each of the memory banks $\mathbf{22}_1$–$\mathbf{22}_p$, as shown. Likewise, the r bit output of driver $\mathbf{26}_m$ is coupled to the r bit set of address terminal, A, of DRAMs $\mathbf{24}_m$ in each of the memory banks $\mathbf{22}_1$–$\mathbf{22}_p$, as shown.

Also, address/control logic 27 produces a row memory access signal on line RAS and a write enable signal on line WR for each one of the drivers $\mathbf{26}_0$–$\mathbf{26}_m$, as shown. Each one of the drivers $\mathbf{26}_0$–$\mathbf{26}_m$ is coupled to the RAS and WR terminals of a corresponding one of the DRAMs $\mathbf{24}_0$–$\mathbf{24}_n$, respectively, in each one of the memory banks $\mathbf{22}_1$–$\mathbf{22}_p$, as shown. Thus, for example, the RAS line output of driver $\mathbf{26}_0$ is coupled to the RAS terminals of DRAMs $\mathbf{24}_0$ in each of the memory banks $\mathbf{22}_1$–$\mathbf{22}_p$, as shown, and the WR line output of driver $\mathbf{26}_0$ is coupled to the WR terminals of DRAMs $\mathbf{24}_0$ in each of the memory banks $\mathbf{22}_1$–$\mathbf{22}_p$, as shown.

A column memory access signal is produced by the address/control 27 on one of a plurality of, here p, lines $CAS_1$–$CAS_p$, for each produced column address. More particularly, each one of the lines $CAS_1$–$CAS_p$ is coupled to a corresponding one of the memory banks $\mathbf{22}_1$–$\mathbf{22}_p$, respectively, as shown. Thus, if an m+1 bit digital word is to be written into, or read from, the DRAMs $\mathbf{24}_0$–$\mathbf{24}_m$ in memory bank $\mathbf{22}_2$, for example, when the r column bits of the address are produced by the drivers $\mathbf{26}_0$–$\mathbf{26}_m$, a column memory access signal is fed to line $CAS_2$. Likewise, if an m+1 bit digital word is to be written into, or read from, the DRAMs $\mathbf{24}_0\mathbf{14}\ \mathbf{24}_m$ in memory bank $\mathbf{22}_p$, for example, when the r column bits of the address are produced by the drivers $\mathbf{26}_0$–$\mathbf{26}_m$, a column memory access signal is fed to line $CAS_p$.

An error detection and correction (EDAC) unit 30 is included. The data bus DB (i.e, bit lines $D_0$–$D_m$) is coupled to EDAC 36, as shown. Therefore, a portion of the digital word on the data bus DE included data and the remaining portion included error detection and correction bits for the Solomon-Reed error detection and correction code. For example, if m=71, there will be 72 DRAMs $\mathbf{24}_0$–$\mathbf{24}_{71}$, and data bus DE will have 64 data bit lines $D_0$–$D_{63}$ and eight error detection bit lines $D_{64}$–$D_{71}$. With such arrangement, a failure of any one of the drivers $26_0$–$26_{71}$ results in an error in only one bit of the 72 bit data stored in a location incorrectly addressed because of the failed driver. This single bit of error in the data is corrected by the EDAC unit 30 upon its retrieval from the memory system 20. Thus, with such an arrangement, a failure of any one of the drivers results in an error in only one bit of the data stored in the incorrectly addressed location, and such single bit error is readily correctable by the EDAC unit upon its retrieval from the memory system.

SUMMARY OF THE INVENTION

In accordance with the invention, a printed circuit board is provided having an elongated electrical conductor disposed on the printed circuit board. The electrical conductor having disposed along a length thereof a plurality of laterally displaced legs. Each one of the legs has a proximal end extending from an edge of the conductor. The printed circuit board has a plurality of conductive vias passing through the printed circuit board, each one of such vias having one end thereof in contact with a corresponding one of the legs.

In accordance with another feature of the invention, the legs are disposed perpendicular to the elongated electrical conductor.

In accordance with another feature of the invention, a printed circuit board is provided having an electrical conductor. The electrical conductor has a first portion disposed on a first level of the printed circuit board and a second portion disposed on a different level of the printed circuit board. The first and second portions are disposed along different directions, such first and second conductors being disposed in overlaying relationship in a common region of the printed circuit board. A plurality of conductive vias is provided passing through the printed circuit board in the common region to electrically interconnect the first and second portions of the electrical conductors.

In accordance with another feature of the invention, one of the portions of the electrical conductor has a leg with a proximal end extending from an edge of the conductor portion and the printed circuit board has a conductive via passing through the printed circuit board, such via having one end thereof in contact with the leg.

In accordance with another feature of the invention, the leg is disposed perpendicular to the conductor portion.

In accordance with still another feature of the invention, a printed circuit board is provided having an array of electrical contact pads disposed on a surface of the printed circuit board and arranged for connection to balls of a ball grid array package. The pads are arranged in rows. A pair of conductive vias is provided. A pair of electrical conductors is disposed in the printed circuit board, the conductors being electrically connected to corresponding alternating ones of rows of the pads through a corresponding one of the pair of vias. The contact pads are disposed between the alternating ones of the rows are electrically isolated from the pair of electrical conductors.

In accordance with another feature of the invention, for each one of the rows of pads, a plurality of electrically conductive vias is provided, each one thereof being electrically connected to one of the electrical conductors.

In accordance with still another feature of the invention, a memory system is provided having a printed circuit board with an array of memory units disposed on a surface of the printed circuit board. The memory units are arranged in a matrix of row and columns. An elongated electrical conductor is disposed on an inner portion of the printed circuit board, the electrical conductor having disposed along a length thereof a plurality of laterally displaced legs. Each one of the legs has a proximal end extending from the conductor. A plurality of conductive vias pass through the printed circuit board, each one of such vias having one end thereof in contact with a corresponding one of the legs and a second end at the surface of the printed circuit board for electrical connection to a corresponding one of the rows of memory units.

In accordance with another feature of the invention, a memory system is provided having a printed circuit board with an array of memory units disposed on a surface of the printed circuit board. The memory units are arranged in a matrix of row and columns. A first pair of elongated electrical conductor is disposed on an inner portion of the printed circuit board, each one of the electrical conductors having disposed along a length thereof a plurality of laterally displaced legs, each one of the legs having a proximal end extending from the conductor. A plurality of conductive vias pass through the printed circuit board, each one of such vias having one end thereof in contact with a one of the legs and a second end at the surface of the printed circuit board for electrical connection to a corresponding one of the rows of memory units. An array of electrical contact pads is disposed on a surface of the printed circuit board and arranged for connection to balls of a ball grid array package, such pads being arranged in rows. A pair of second conductive vias is provided. A second pair of the electrical conductors is electrically connected to corresponding alternating ones of rows of the pads through a corresponding one of the pair of second conductive vias, each one the conductors in the second pair thereof being electrically connected to a corresponding one of the conductors in the first pair thereof. The contact pads disposed between the alternating ones of the rows are electrically isolated from said pair of electrical conductors.

With such arrangements, redundancy and layout arrangement are provided to the printed circuit board thereby improving the fault tolerance of the memory system.

BRIEF DESCRIPTION OF THE DRAWING

For a more complete understanding of the invention, reference is now made to the following description taken together in conjunction with the accompanying drawing, in which:

FIG. 15 is a block diagram of port $P_A$/port $P_B$ data sections used in the interface section of FIG. 13.

DESCRIPTION OF THE PREFERRED EMBODIMENTS

Figure 3:
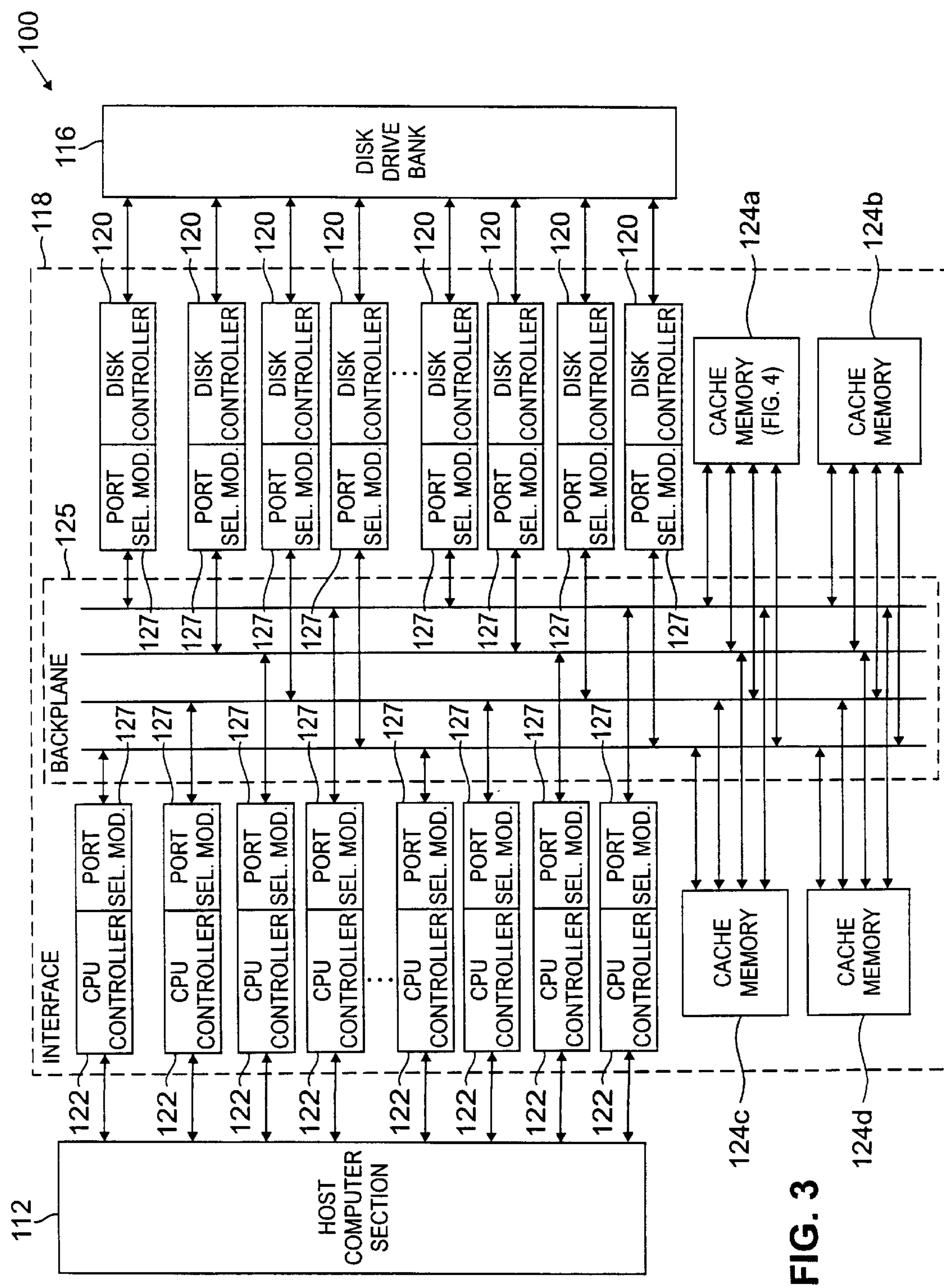
FIG. 3 is a block diagram of a computer system using a data storage system in accordance with the invention.

Referring now to FIG. 3, a computer system 100 is shown. The computer system 100 includes a host computer section 112 (e.g., a main frame or open systems computer section) having main frame processors, not shown, for processing data. Portions of the processed data are stored in, and retrieved data from, a bank 116 of disk drives through an interface 118.

The interface 118 includes disk controllers 120, central processor unit (CPU) controllers 122 and addressable cache memories 124*a*, 124*b*, 124*c*, and 124*d* electrically interconnected through a backplane 125, here four CONTROL/DATA buses; i.e., an A bus, a B bus, a C bus, and a D bus, as shown. The cache memories 124*a*, 124*b*, 124*c* and 124*d* are hereinafter sometimes referred to as memory section 124*a*, 124*b*, 124*c* and 124*d*, respectively.

More particularly, in order to provide data integrity in case of a failure in a disk controller 120 or CPU controller 122, the four of CONTROL/DATA buses (i.e., A bus, B bus, C bus and D bus) are provided. One portion of the disk controllers 120 is connected to one of the A bus, a second portion to the B bus, a third portion to the C bus and the remaining portion to the D bus. Likewise, one portion of the CPU controllers 122 is connected to the A bus, a second portion to the B bus, a third portion to the C bus and the remaining portion to the D bus. Each one of the controllers 120, 122 includes a microcomputer having stored in a memory thereof a port select module 127 to be described in detail hereinafter. The cache memories 124*a*, 124*b*, 124*c* and 124*d* are connected to all four CONTROL/DATA buses, (i.e., the A bus, the B bus, the C bus and the D bus) as shown.

Each one of the controllers 120, 122 is adapted to assert on the CONTROL/DATA bus coupled thereto during a controller initiated control/data bus assert interval address control signal, including: (A) memory address signal; (B) memory command including a write operation request, a read operation request, and clock signals. A timing protocol suitable for use in the system 100 is described in my co-pending patent application entitled "TIMING PROTOCOL FOR A DATA STORAGE SYSTEM", filed on Dec. 23, 1997, assigned to the same assignee as the present invention, the entire subject mater thereof being incorporated herein by reference.

Figure 4:
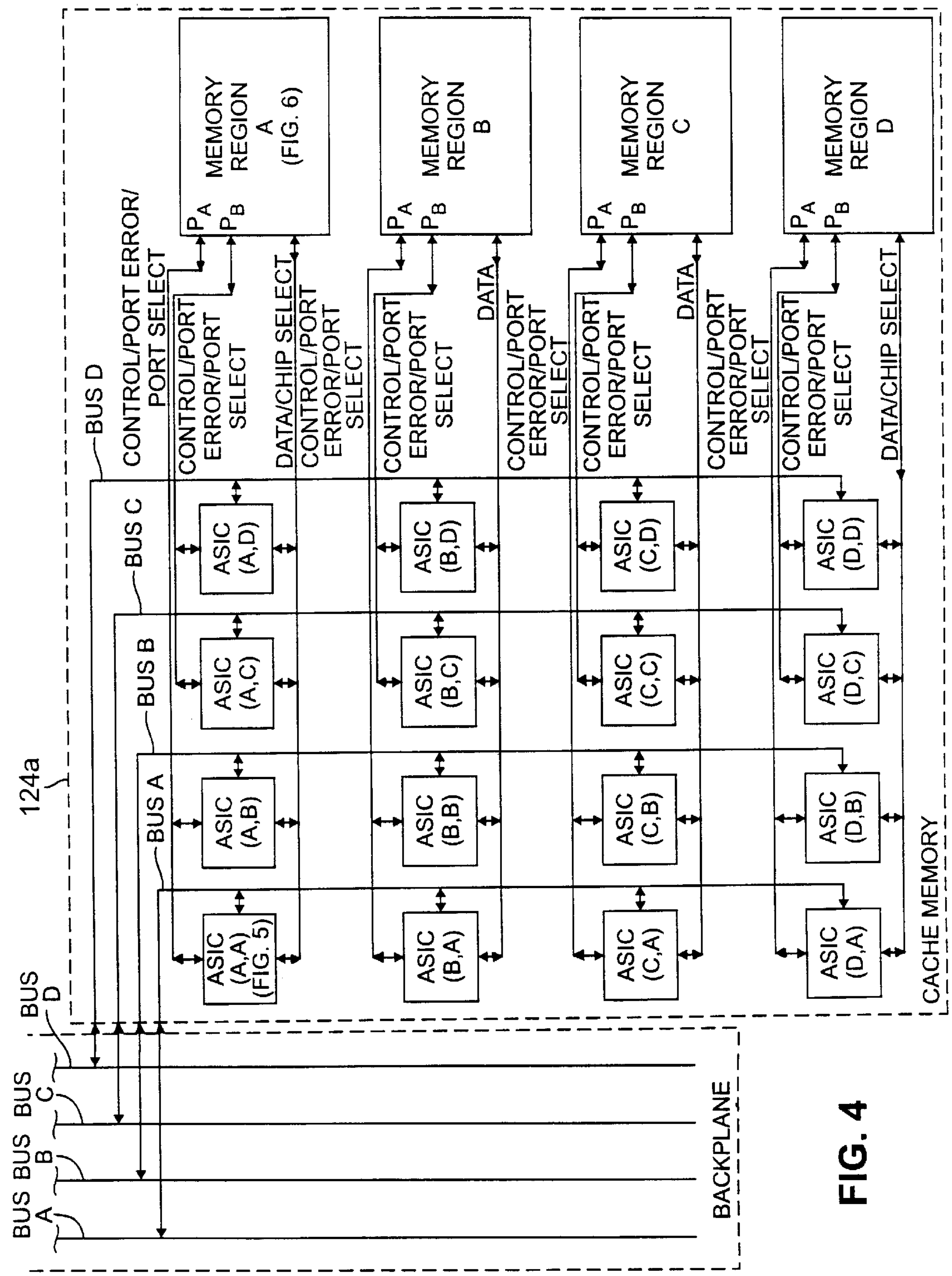
FIG. 4 is a block diagram of an exemplary one of a plurality of cache memories used in the system of FIG. 3.

An exemplary one of the cache memory sections 124*a*–124*d*, here memory section 124*a* is shown in detail in FIG. 4. Such memory section 124*a* includes a plurality of, here four random access memory (RAM) regions (i.e. RAM region A, RAM region B, RAM region C and RAM region D, as shown, and a matrix of rows and columns of control logic sections, here Application Specific Integrated circuits (ASICs), i.e, control logic section ASIC A,A . . . control logic section ASIC D,D. Each one of the four columns of control logic section ASICs is coupled to a corresponding one of the control/data buses. More particularly, a first column of control logic sections (i.e., ASICs A,A; B,A; C,A and D,A) are coupled to the A bus. A second column of control logic sections (i.e., ASICs A,B; B,B; C,B and D,B) are coupled to the B bus. A third column of control logic sections (i.e., ASICs A,C; B,C; C,C and D,C) are coupled to the C bus. A fourth column of control logic sections (i.e., ASICs A,D; B,D; C,D and D,D) are coupled to the D bus.

Each one of the rows of the control logic sections ASIC A,A . . . ASIC D,D is coupled to a corresponding one of the four RAM regions, RAM region A . . . RAM region D, via a DATA BUS, as indicated. It is noted that the data on the DATA BUS includes a plurality of, here N sets of bits. Here, each set of bits includes four bits, i.e., a nibble. The first row of ASICs A,A; A,B; A,C; and A,D is coupled to the DATA BUS of RAM region A. The second row of ASICs B,A; B,B; B,C; and B,D is coupled to the DATA BUS of RAM region B. The third row of ASICs C,A; C,B; C,C; and C,D is coupled to the DATA BUS of RAM region C. The fourth row of ASICs D,A; D,B; D,C; and D,D is coupled to the DATA BUS of RAM region D.

It is noted that each one the memory regions, i.e. memory region A, memory region B, memory region C and memory region D has a pair of redundant ports for control and port error signal; i.e., a port $P_A$ and a port $P_B$, as indicated. One of the ports $P_A$, $P_B$ is coupled to one portion of the ASICs in a corresponding one of the rows thereof and the other one of the ports $P_A$, $P_B$ is coupled to the other portion of the ASICs in the corresponding one of the rows thereof. Thus, port $P_A$ of memory region A is coupled to ASICs A,A and A,B and port $P_B$ of memory region A is coupled to ASICs A,C and A,D via a pair of CONTROL/PORT ERROR BUSES, as indicated. Likewise, port $P_A$ of memory region B is coupled to ASICs B,A and B,B and port $P_B$ of memory region B is coupled to ASICs B,C and B,D via a pair of CONTROL/PORT ERROR BUSES, as indicated. In like manner, port $P_A$ of memory region C is coupled to ASICs C,A and C,B and port $P_B$ of memory region C is coupled to ASICs C,C and C,D via a pair of CONTROL/PORT ERROR BUSES, and port $P_A$ of memory region D is coupled to ASICs D,A and D,B and port $P_B$ of memory region D is coupled to ASICs D,C and D,D via a pair of CONTROL/PORT ERROR BUSES, as indicated.

It should be noted that the control logic sections ASIC A,A . . . ASIC D,D in each of the four rows thereof are interconnected through an arbitration bus, not shown, in a manner described in detail in co-pending patent application entitled "Bus Arbitration System", filed Dec. 23, 1997, inventors Christopher S. MacLellan and myself, John K. Walton, assigned to the same assignee as the present invention, the entire subject matter thereof being incorporated in this patent application.

Figure 5:
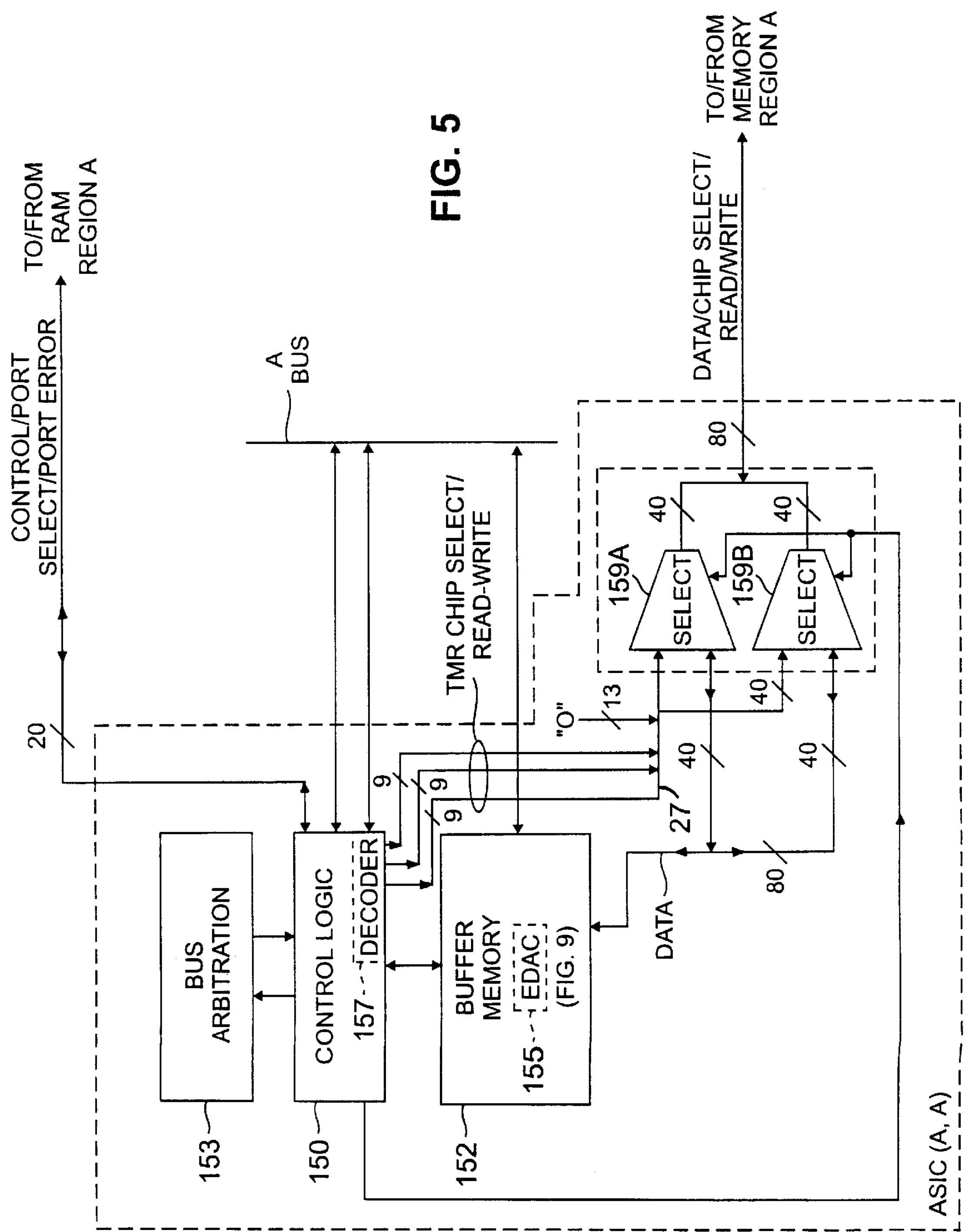
FIG. 5 is a block diagram of an exemplary one of a plurality of ASIC control logics used in the cache memories of FIG. 4.
Figure 9:
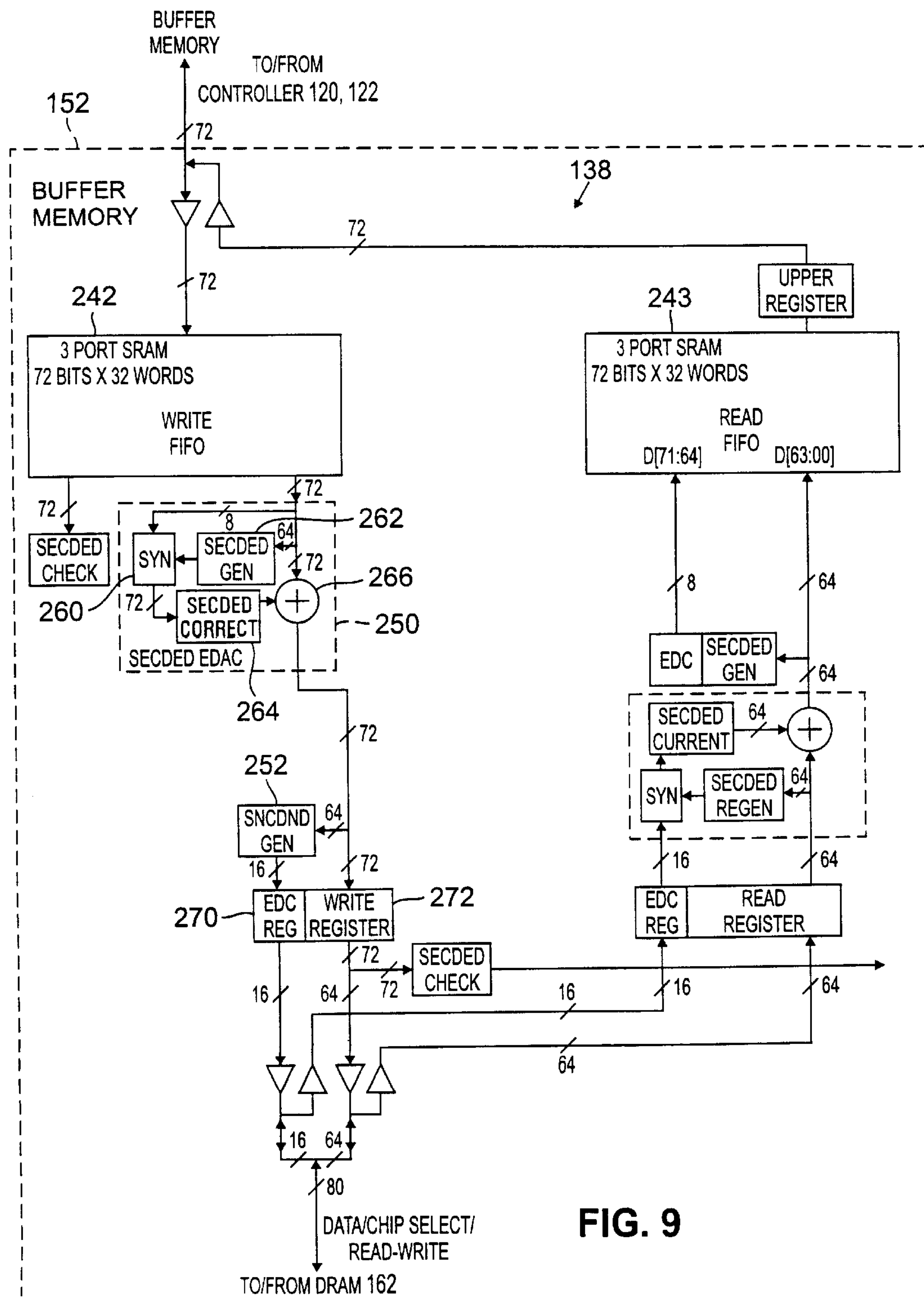
FIG. 9 is a block diagram of a buffer memory used in the ASIC control logic of FIG. 5.

Each one of such control logic sections ASICs A,A–D,D is identical in construction, an exemplary one thereof, here control logic section ASIC A,A being shown in detail in FIG. 5 to include a control logic 150 having control logic and a buffer memory 152 to be described in connection with FIG. 9 and in the above-referenced co-pending patent application entitled "TIMING PROTOCOL FOR A DATA STORAGE SYSTEM". Suffice it to say here, however, that the buffer memory 152 includes a Single Nibble Correction/Double Nibble Detection (SNCDND) EDAC 155. The SNCDND and SNCDND EDACs are described in a paper entitled "Single Byte Error Correcting-Double Byte Error Detecting Codes for Memory Systems" by Shigeo Kaneda and Eiji Fujiwara, published in IEEE Transactions on Computer, Vol. C-31, No. 7, July 1982. pages 569–602, the entire subject matter thereof being incorporated herein by reference and the buffer memory 152 with EDAC 155 are also described in detail in co-pending patent application entitled "Memory Having Error Correction and Detection", filed Sep. 29, 1997, assigned to the same assignee as the present invention, the entire subject matter thereof being incorporated herein by reference. Here, SNCDND EDAC 155 receives data having 64 bits with 8 redundant bits, i.e., a 72 bit word. Thus, the error detection and correction unit is adapted to detect an error in the address control signal fed to one of the memory units and enable correction of data read from such memory unit. Further, the error detection and correction unit is adapted to detect an error in the address control signal fed to more than one of the memory units (i.e., here two memory units) and enable detection of data read from such memory unit.

The ASIC (A,A) controls transfer of data between the buffer memory 152 and the one of the plurality of control/data buses (i.e., A bus, B bus B, C bus and D bus) coupled to the control logic section ASIC A,A, here bus A. The control logic section ASIC A,A is adapted to produce a control/data bus request for the one of the control/data buses coupled thereto (here RAM region A) and is adapted to effect the transfer in response to a control/data bus grant fed to the control logic section (here ASIC A,A) in accordance with a protocol described in the above-referenced, co-pending application entitled "TIMING PROTOCOL FOR A DATA STORAGE SYSTEM". The control logic section ASIC A,A also includes a bus arbitration section 153 described in detail in connection with the above referenced patent application entitled "Bus Arbitration System", filed Dec. 23, 1997, inventors Christopher S. MacLellan and myself, John K. Walton.

The control logic 150 includes a decoder 157 for decoding the eight chip select signals (i.e., $CS_0$–$CS_M$, where here M=7) and one read/write signals on the A bus. The decoder 157 produces three copies of the eight chip select signals ($CS_0$–$CS_7$) and one read/write signals and combines these twenty-seven lines with thirteen lines having logic 0 to form forty lines which are fed to a selector section 159. Three copies are made for Triple Modular Redundancy (TMR). The selector section 159 has a pair of selectors 159A, 159B. The above-described forty lines are fed to a first input of both selectors 159A, 159B, as indicated in FIG. 5. The other input of the selector 159 is fed by the data passing between the buffer memory 152 and the RAM memory region A. More particularly, the data passing between the memory region A and the buffer memory 152 is here 80 bits (i.e, lines). Forty of the eighty lines are fed to a second input of selector 159A and the other forty lines of data are fed to a second input of selector 159B, as indicated. (Thus, the selector section 159, as to the data, is a bidirectional selector section.) The two inputs to the selectors 159A and 159B are time multiplexed through the selectors 159A, 159B by a control signal fed to the selectors 159A, 159B by the control logic 150. Here, the chip select and read/write signals first pass through the selector section 159 followed by the data. Thus, the output of selector section 159 is eighty lines; a pair of three sets of nine of the lines being used for chip select and read/write signals during a first time period (it being noted that the thirteen lines having logic 0 are not used). During the succeeding time period, these eighty lines are used for data.

Figure 6:
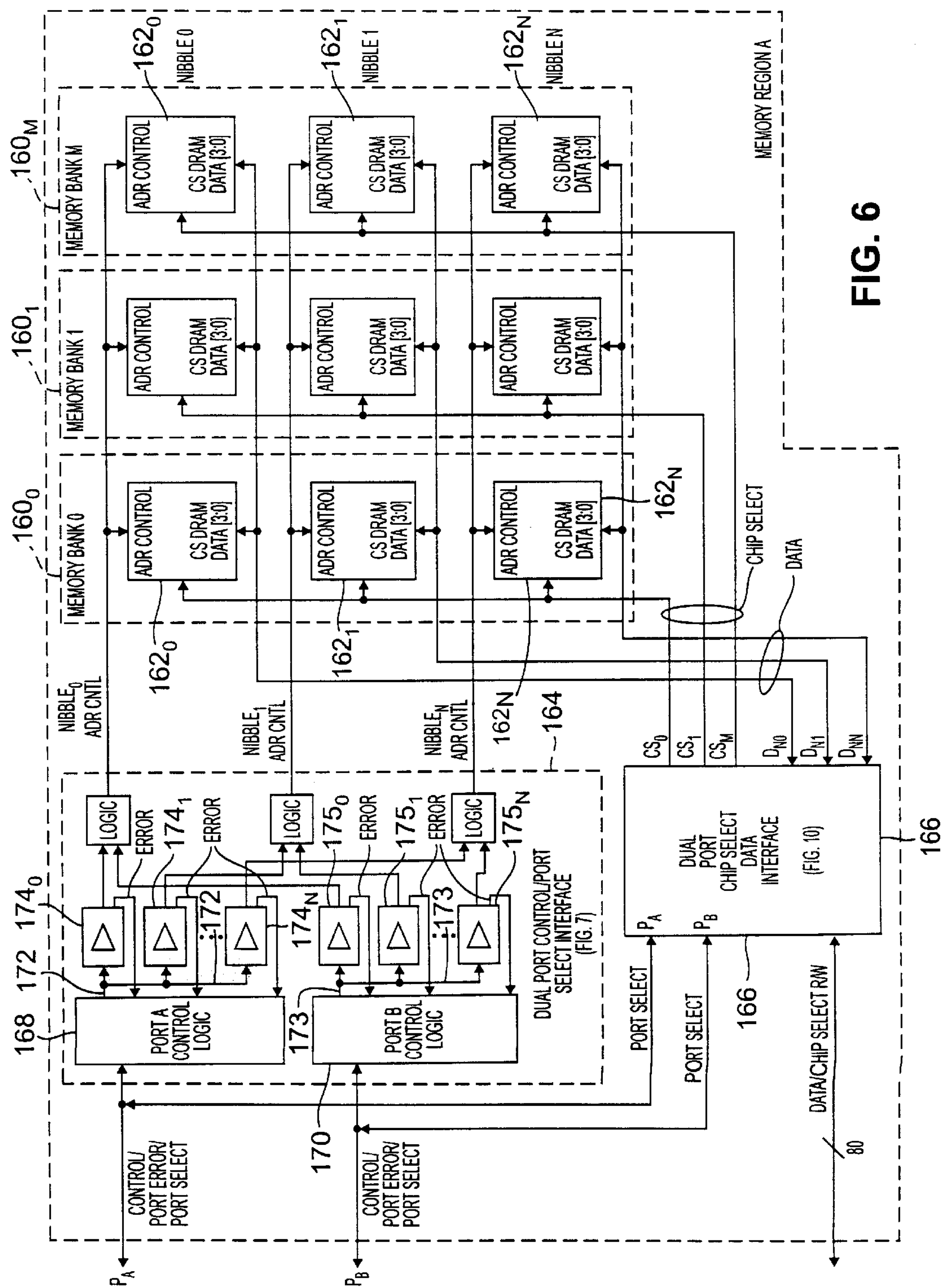
FIG. 6 is a block diagram of an exemplary one of a plurality of memory regions used in the cache memory of FIG. 4.

Referring now to FIG. 6, an exemplary one of the memory regions A, B, C and D, here memory region A, is shown to include a plurality of memory banks. Each one of the memory banks includes a plurality of, here M+1=8, addressable memory units $\mathbf{160}_0$–$\mathbf{160}_M$, here 4 bit by 16 megabits synchronous DRAMs. Each one of the memory units $\mathbf{160}_0$–$\mathbf{160}_m$ has a memory address control terminal ADR CONTROL and a four bit (i.e., nibble) data terminal DATA 0:3. Each one of the sets of data (i.e., here 4 bits, (i.e., a nibble)) is fed to the data terminals DATA 0:3 of a corresponding one of the memory units $\mathbf{162}_0$–$\mathbf{162}_N$ in each one of the memory banks $\mathbf{160}_0$–$\mathbf{160}_N$. Thus, here N is 20 and there are only 20 DRAM packages (i.e., memory units) 162, each having the address control signals therefor fed by a corresponding one of 20 driver sections 174, 175, to be described in connection with FIGS. 6 and 7). As mentioned above, a nibble EDAC 155 (SNCDND) is included in the buffer memory 152. Therefore, a fault in the address control signals fed to any one of the 20 memory units 162 through any one of the driver sections 174, 175 will result in a correctable fault and the data read from the memory units addressed by the fault will be corrected by the SNCDND EDAC 155. Furthermore, a fault in the address control signals fed to more than one of the 20 memory units 162 through any one of the driver sections 174, 175 will result in a detectable fault.

Figure 7:
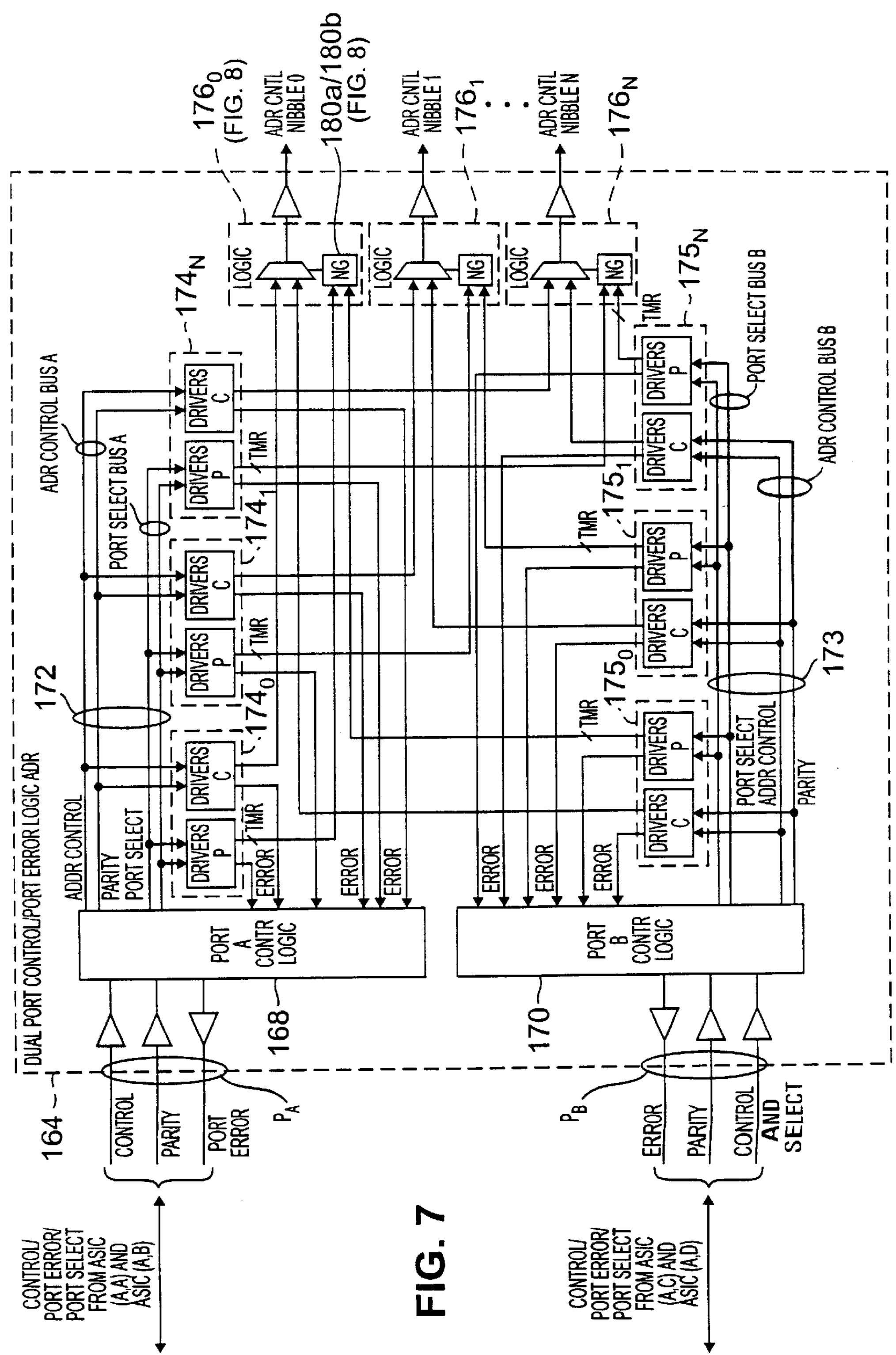
FIG. 7 is a block diagram of a dual port control error/port error interface used in the memory region of FIG. 6.

The memory region A also includes a dual port control/port error interface 164, shown in more detail in FIG. 7, and a dual port chip select/data interface 166. The dual port control/port error interface 164 includes a port A logic 168 coupled to port $P_A$ and a port B logic 170 coupled to port $P_B$. It is first noted that both the port A logic 168 and the port B logic 170 operate independently but in like manner. Thus, referring also to FIG. 7, it is noted that the address control signal at port $P_A$ and port $P_B$ each includes a parity bit. Thus, considering port A logic 168, such logic 168 checks for any parity error in the control signal fed thereto by one of the CPU controllers 120 (FIG. 3) or a disk controller 122, and if there is a parity error, an address control signal error signal is produced therein to the port select module 127 of the one of the controller 120, 122 which sent the command. Further, in the presence of a detected parity error, the address control signal sent to the port A control logic 168 is converted by such port A control logic 168 into a "no operation" (NO OP) command with a parity bit. Also fed to the control logic 168 is a port select signal with a parity bit. Thus, the data stored in the memory region A does not change with the result that data corruption is prevented. That is, a "no operation" (NO OP) command wherein the addressed memory leaves the data stored therein unchanged. (It should be noted that when a write operation is requested during a subsequent control/data bus grant interval, data and bus write clock pulses on the DATA bus are written into the addressed memory, it being understood that data on the DATA bus is not written into the addressed memory if the memory command sent thereto is a NO OP command).

Further, the logic 168 checks for any parity error in a port select signal fed thereto by one of the CPU controllers 120 (FIG. 3) or a disk controller 122 supplying the address control signal, and if there is a parity error, a port select error signal is produced therein to the port select module 127 of the one of the controller 120, 122 which sent the command. Further, in the presence of a detected parity error, the address control signal sent to the port A control logic 168 by the port select signal is converted by such port A control logic 168 into a NO OP command with a parity bit. Thus, the data stored in the memory region A does not change with the result that data corruption is prevented.

In like manner, port B logic 170 checks for any parity error in the control signal fed thereto by one of the CPU controllers 120 (FIG. 3) or a disk controller 122, and if there is a parity error, an address control signal error signal is produced therein to the port select module 127 of the one of the controller 120, 122 which sent the command. Further, in the presence of a detected parity error, the address control signal sent to the port B control logic 170 is converted by such port B control logic 168 into a NO OP command with a parity bit. Thus, here again, the data stored in the memory region A does not change with the result that data corruption is prevented. Further, the logic 170 checks for any parity error in a port select signal fed thereto by one of the CPU controllers 120 (FIG. 3) or a disk controller 122 supplying the address control signal, and if there is a parity error, a port select error signal is produced therein to the port select module 127 of the one of the controller 120, 122 which sent the command. Further, in the presence of a detected parity error, the address control signal sent to the port B control logic 170 by the port select signal is converted by such port B control logic 170 into a NO OP command with a parity bit. Thus, the data stored in the memory region A does not change with the result that data corruption is prevented.

If port A control logic 168 reports a parity error indicating that a fault has occurred in the path between the controller 120, 122 which presented the address control and/or port select signal to port $P_A$, such controller 120, 122 is advised of such fault; however, such controller is free to transmit control to the memory region A using port $P_B$ as the access port. In like manner, if port B control logic 170 reports a parity error indicating that a fault has occurred in the path between the controller 120, 122 which presented the control and/or port select signal to port $P_B$, such controller 120, 122 is advised of such fault; however, such controller is free to transmit control to the memory region A using port $P_A$ as the access port. (It is noted that a system for reporting faults (i.e., parity errors, for example) is described in a co-pending patent application entitled "Data Storage System", inventor John K. Walton, assigned to the same assignee as the present invention, filed on the same date as this patent application, the entire subject matter thereof being incorporated into this application by reference.)

If the port A control logic determines that there is no parity error in the address control signal at port $P_A$, the address control signal and port select signals are fed by a common interconnecting bus 172 to each of a plurality of, here, N+1, driver sections $174_0$–$174_N$. The driver sections $174_0$–$174_N$ includes parity checkers, not shown. Referring also to FIG. 7, it is noted that the bus 172 includes an ADR CONTROL $BUS_A$ (which carries the address control portion of the control signal, with its parity bit, at port $P_A$) and a PORT SELECT $BUS_A$ (which carries the port select portion of the control signal, with its parity bit, at port $P_A$). Each one of the driver sections $174_0$–$174_N$ includes a pair of drivers, a port select driver P, coupled to the PORT SELECT $BUS_A$ and a control driver C coupled to the CONTROL $BUS_A$, as indicated. Each one of the pair of drivers P, C includes a parity checker. The control signals produced at the output of the each one of the N+1 C drivers are fed to a corresponding one of a plurality of N+1 selector logics $176_0$–$176_N$, as indicated.

Likewise, if the port B control logic 170 determines that there is no parity error in the address control signal at port $P_B$, the address control signal is fed by bus 173 to each of a plurality of, here, N+1, driver sections $175_0$–$175_N$. The driver sections $175_0$–$175_N$ includes parity checkers, not shown. Referring also to FIG. 7, it is noted that the bus 173 includes an ADR CONTROL $BUS_A$ (which carries the address control portion of the control signal, with its parity bit, at port $P_B$) and a PORT SELECT $BUS_B$ (which carries the port select portion of the control signal, with its parity bit, at port $P_B$). Each one of the driver sections $175_0$–$175_N$ includes a pair of drivers, a port select driver P, coupled to the PORT SELECT $BUS_B$ and a control driver C coupled to the CONTROL $BUS_B$, as indicated. Each one of the pair of drivers P, C includes a parity checker. The control signals produced at the output of the each one of the N+1 C drivers are fed to a corresponding one of the plurality of N+1 selector logics $176_0$–$176_N$, as indicated.

Figure 8:
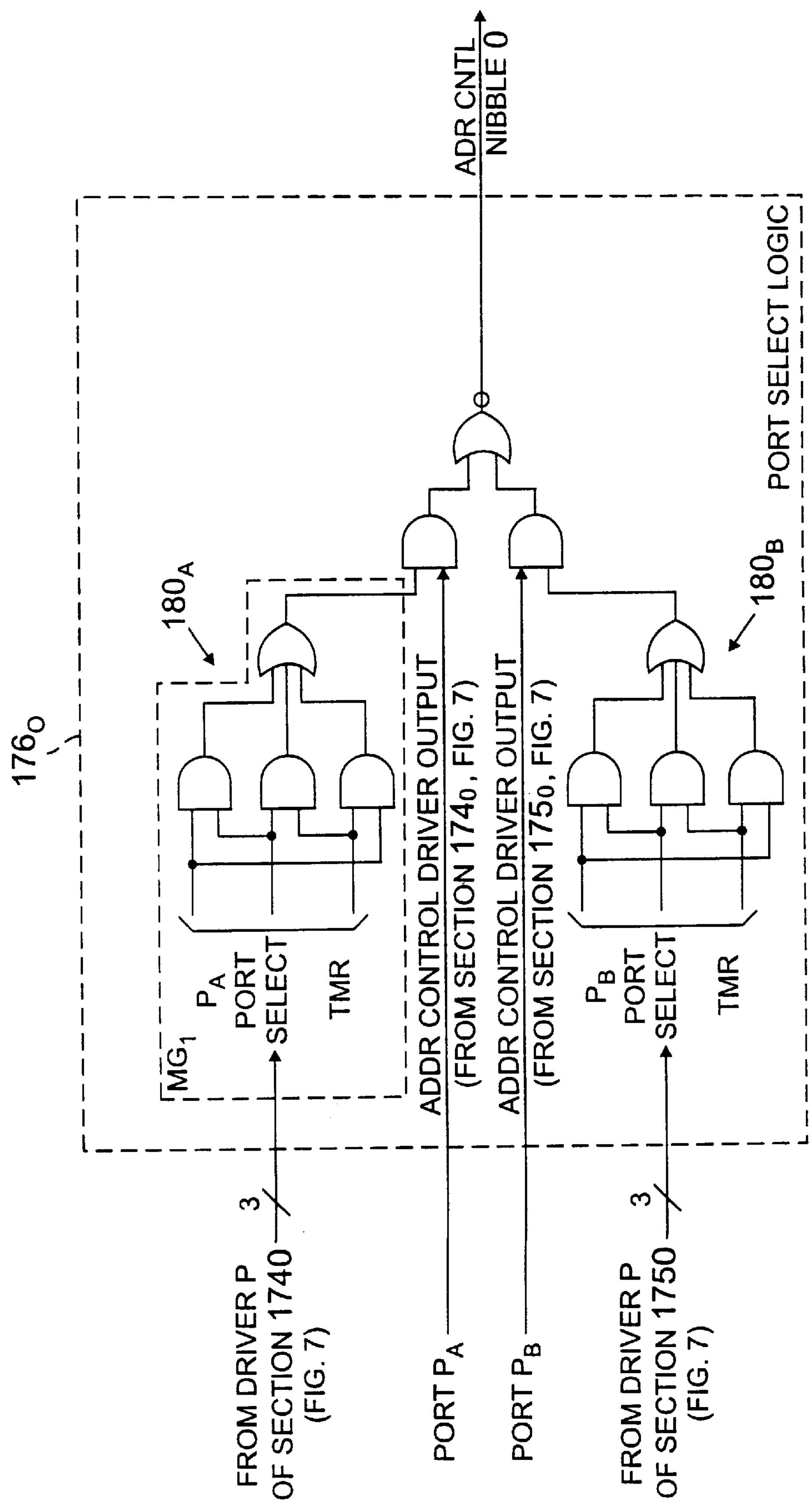
FIG. 8 is an exemplary one of a plurality of selector logics used in the dual port control error/port interface section of FIG. 7.

Each one of the selector logics $176_0$–$176_N$ is identical in construction, an exemplary one thereof, here logic $176_0$ being shown in FIG. 8. The logic $176_0$ includes a pair of majority gates $180_A$, $180_B$. Majority gate $180_A$ is fed by the P driver of driver section $174_0$ and majority gate $180_B$ is fed by the P driver of driver section $175_0$. It is noted that Triple Modular Redundancy (TMR) is used. Therefore, the port select signal from P driver of driver section $174_0$ is fed to the logic $176_0$ through three different drivers so that if there is a fault in one of the three drivers the port select signal is assumed valid by majority gate $180_A$. Likewise, the port select signal from P driver of driver section $175_0$ is fed to the logic $176_0$ through three different drivers so that if there is a fault in one of the three drivers the port select signal is assumed valid by majority gate $180_B$. It should also be noted that a port A select signal and port B select signal are mutually exclusive, i.e., only a port A select signal or a port B select signal can exist at any one control execution time duration. Thus, if there is a valid port A select signal or a valid port B select signal, the control signal produced by the C driver in the section $174_0$, $175_0$ of the selected port is fed through the logic $176_0$ to each of the M+1=8 DRAMs $162_0$ (FIG. 6).

Further, if there is a parity error in the control fed to one of the C drivers, such driver: (A) reports a parity error to the CPU or disk controller which sent the control signal via CONTROL/PORT ERROR BUS at port A control logic 168; and (B) converts the control at the output of such driver P to a NO OP command thereby preventing the corruption of any data in the DRAMs $162_0$ (FIG. 6) coupled to such parity error detecting driver C. It is noted that if only one of the N+1 drivers C detects a parity error, the data in the DRAMs 162 coupled thereto is correctable by the nibble EDAC in buffer memory 152 (FIG. 5). Further, it is noted that if more than one of the N+1 drivers C detects a parity error, such is detectable by the nibble EDAC in buffer memory 152 (FIG. 5); however because of the NO OP command, data stored in the DRAMs 162 is not corrupted. Further, it is noted that if there is an un-correctable fault in one path (i.e., between one of the controller 120, 122 and one port (i.e., port A, for example)), the system 100 has another path (i.e., between one of the controller 120, 122 and the other port, (i.e., port B, for example)) which is completely independent with respect to any fault in the other path and not encounter the fault in the first path. Thus, if a fault occurs in the portion of the bus 172 (FIG. 7) between driver section $174_N$ and driver $174_{N-1}$, data retrieved from the memory units $162_N$ (FIG. 6) is correctable by the SNCDND EDAC 155.

In summary, if there is a error in any path to a fault detection circuit, i.e., the path from a controller 120, 122 to either the port $P_A$ or port $P_B$ of the control logics 168, 170, or the path between the output of either the control logic 168 and any one of the driver sections $174_0$–$174_m$ or the path between the output of either the control logic 170 and any one of the driver sections $175_0$–$175_M$, a parity error signal is sent back to the controller 120, 122 issuing the control signal and a NO OP command is used to prevent data corruption. For example, if the fault were in the path from a controller 120, 122 to port $P_A$ of control logic 168, a NO OP command would prevent corruption of data and the controller 120, 122 issuing the control signal would know of the fault but data may be stored in the memory region A by accessing such memory region A by the other port, i.e., port $P_B$. Further, if the control signal passes through a control logic 168, for example, without an error then the control signal goes to the driver sections $174_0$–$174_M$. If the control logic 168 passes to one of the driver sections $174_0$–$174_M$ with a parity error, then the driver section $174_0$–$174_M$ detects the error and the control signal is converted into a NO OP signal and an error indication signal is sent back to the controller 120, 122 issuing the control signal through the control logic 168. In the case of only one of the driver sections $174_0$–$174_M$ detecting the parity error, only one nibble of data gets the NO OP command and the data in such nibble is correctable by the EDAC 155 (FIG. 5). Or, if more than one of the driver sections $174_0$–$174_M$ detects a parity error, more than one parity error signal is fed back via the control logic 168 and this is a detectable, non-correctable error by EDAC 155. In each case, there is no corruption of data because of the issuance of NO OP commands. Thus, with system 100, every fault is detectable or, if correctable, is correctable. Further, because of the NO OP command, data is not corrupted; it is either detectable or correctable.

Figure 10:
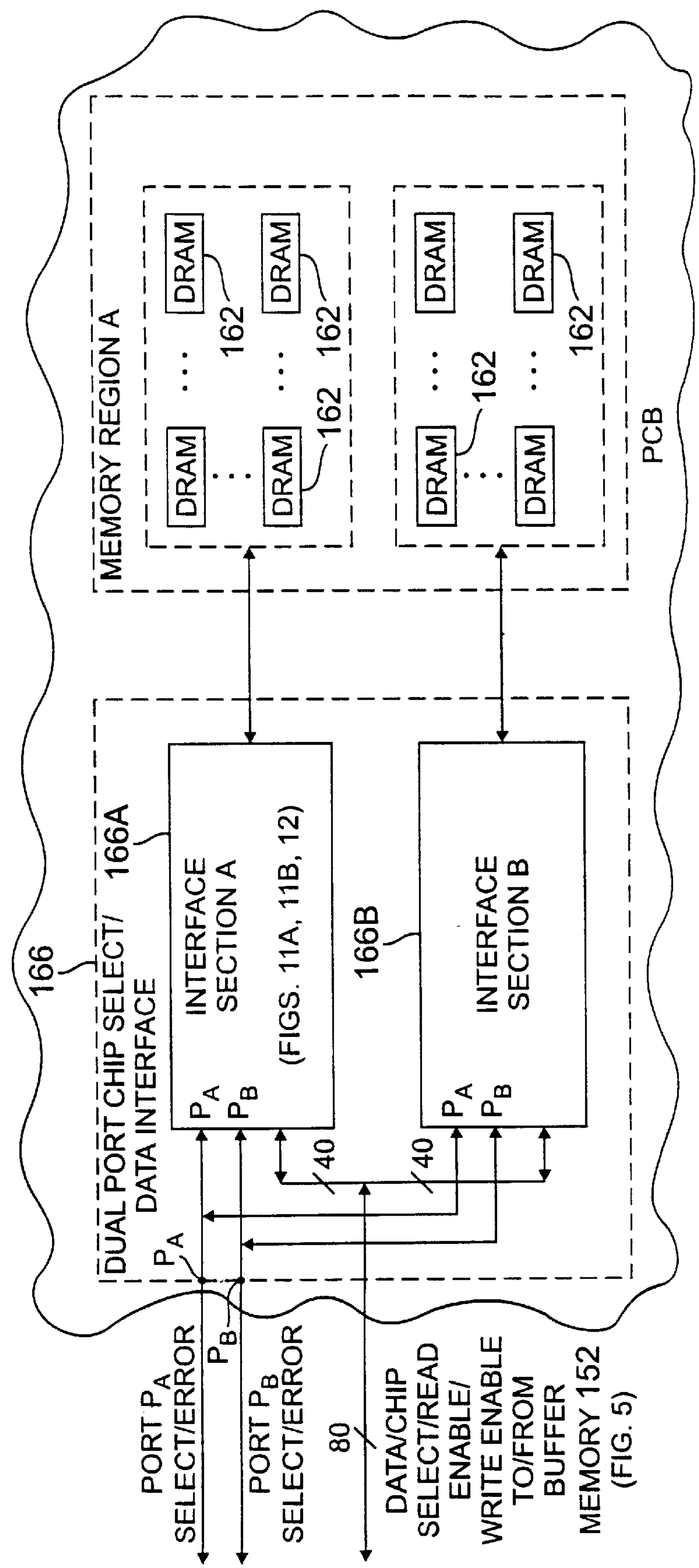
FIG. 10 is a diagrammatical sketch of a printed circuit board (PCB) having mounted thereon the dual port chip select/data interface used in the memory region of FIG. 6.
Figure 11A:
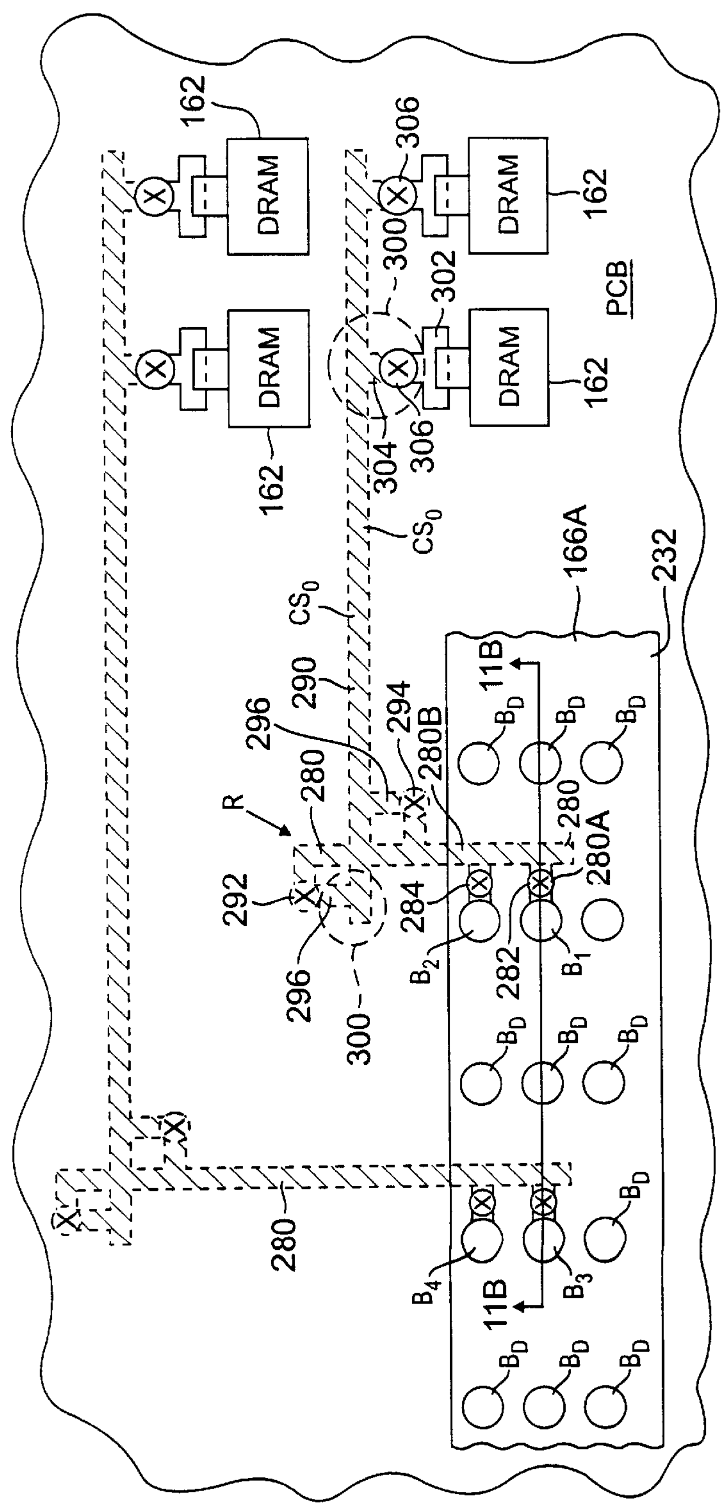
FIG. 11A is a diagrammatical plan view sketch on the to surface of a portion of the PCB of FIG. 10.
Figure 11B:
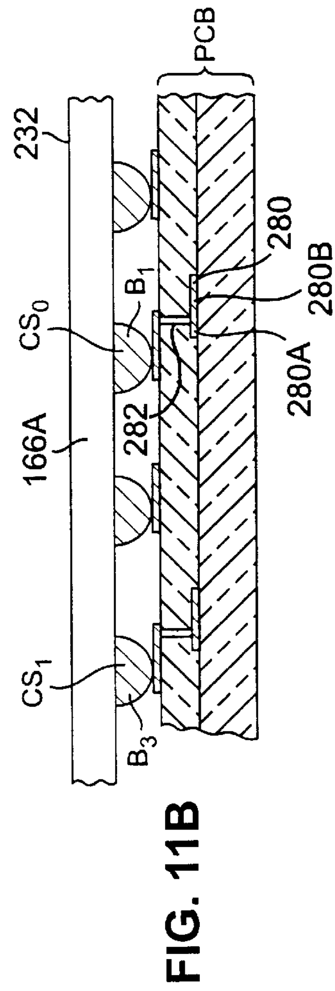
FIG. 11B is a diagrammatical cross-sectional sketch of the PCB of FIG. 11A, such cross section being taken along line 11B—11B of FIG. 11A.

The dual port chip select/data interface 166, as shown in FIG. 10, is fed by a port A select signal from either ASICs (A,A) or (A,B), FIG. 4, and by a port B select signal from either ASICs (A,A) or (A,B). As noted above, the port A and port B signals are mutually exclusive. The dual port chip select/data interface 166 is also fed by the time multiplexed: chip select and read/write signals; and data, as described above in connection with and selector 159 (FIG. 5). The interface 166 includes two interface sections 166A, 166B mounted laterally to the upper and lower surface of a printed circuit board (PCB), as indicated in FIGS. 11A and 11B for the upper surface. It is also noted that DRAMs 162 of the memory region A (FIG. 6) are mounted to the upper surface of the PCBs, as indicated. Each one of the interface section 166A, 166B is identical in construction, as exemplary one there, here section 166A being shown in detail in FIG. 12.

Figure 12:
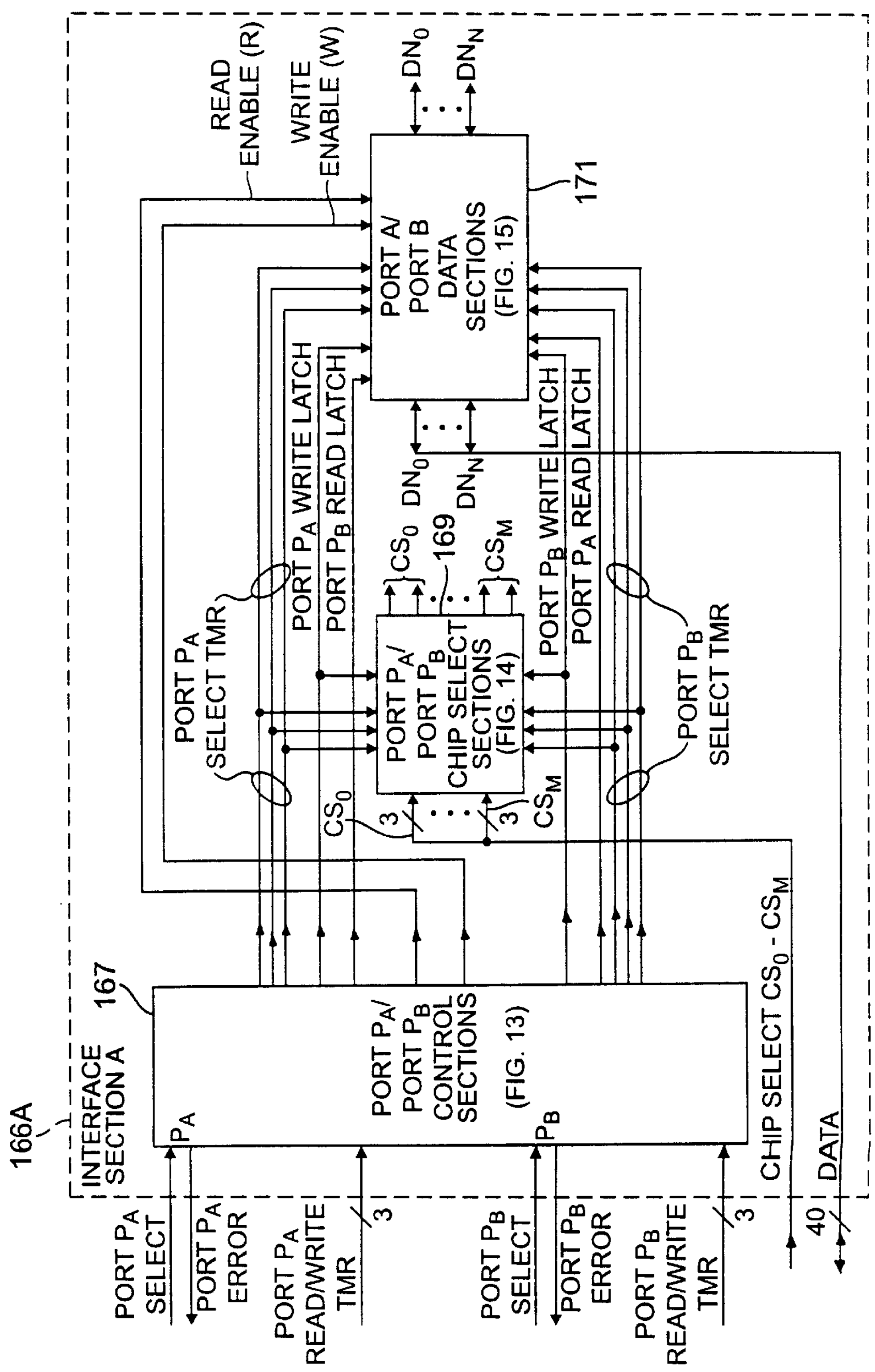
FIG. 12 is a block diagram of an exemplary one of a pair of the dual port chip select/data interface sections used to provide the dual port chip select/data interface section of FIG. 10.

Thus, referring to FIG. 12, interface section 166A includes a port $P_A$/port $P_B$ control sections 167, to be described in connection with detail in FIG. 13, port $P_A$/port $P_B$ chip select sections 169, to be described in detail in connection with FIG. 14 and a port $P_A$/port $P_B$ data sections 171, to be described in detail in connection with FIG. 15, all arranged as shown. Thus, referring to the port $P_A$/port $P_B$ control sections 167 (FIG. 13), such sections 167 includes a port $P_A$ control section 173A and a port $P_B$ control section 173B. Each one of the port $P_A$ and port $P_B$ control sections 173A. 173B is identical in construction, an exemplary one thereof, here port $P_A$ control section 173A being shown in detail to include a control logic 174 fed by the port $P_A$ select signal from ASICs (A,A) and (A,B) and a read/write enable signal via a Majority Gate (M.G.) 175. That is, here the ASIC (A,A) feeds the three copies of the read/write signal, as described in connection with FIG. 5) to the Majority Gate 175. If two, or more of the read/write signals are the same, the signal is assumed correct and is passed to the control logic 167; otherwise, and error signal is returned to the control logic 150 (FIG. 5). Likewise, if there is a parity error in the port $P_A$ select signal, a parity error is returned to the control logic 150 (FIG. 5). Further, the read/write signal produced by the Majority Gate 175 is decoded by the control logic 174 into two output lines; i.e., a port $P_A$ write enable and a port $P_A$ read enable.

Figure 13:
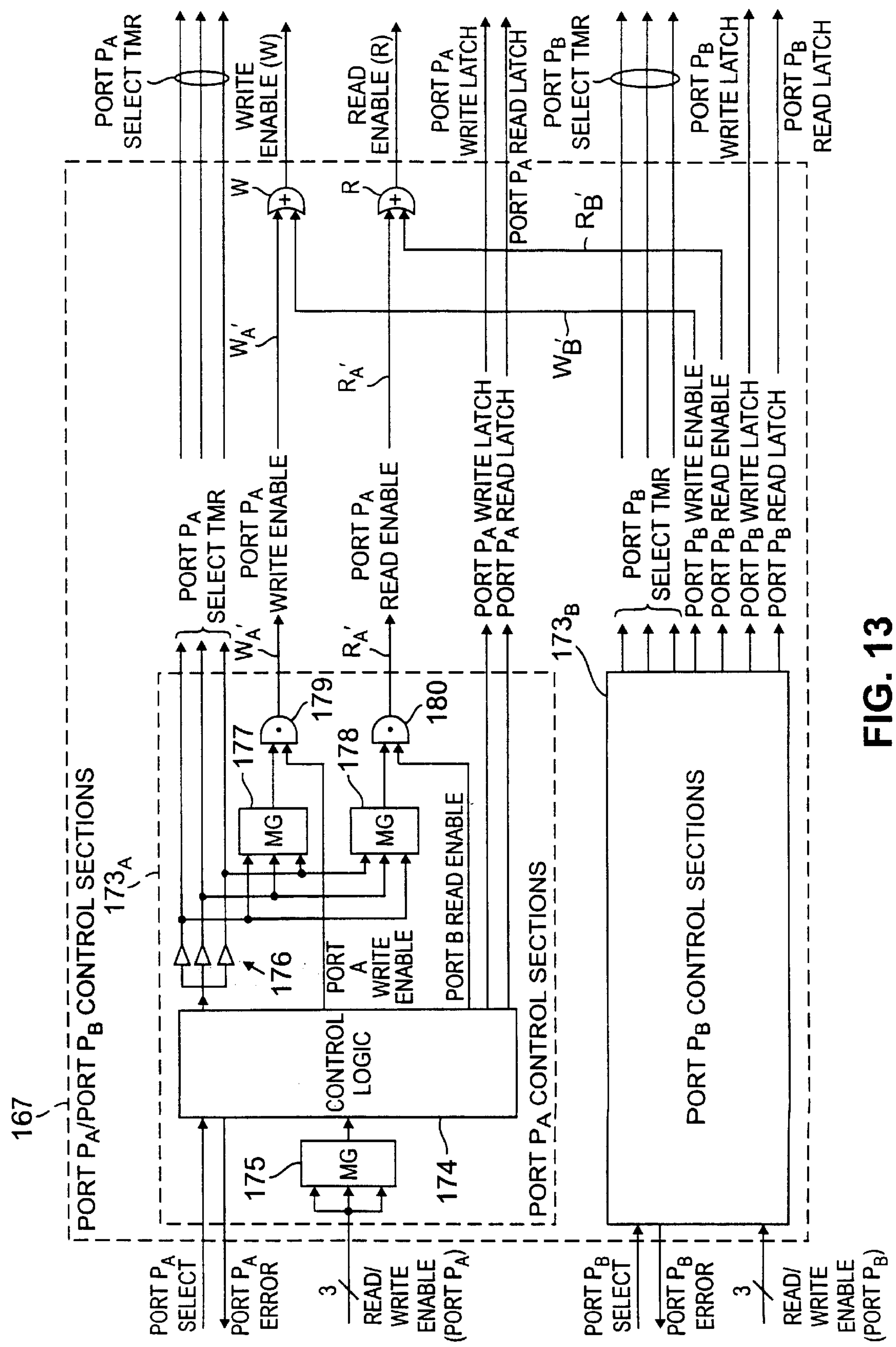
FIG. 13 is a block diagram of port $P_A$/port $P_B$ control section used in the interface section of FIG. 12.

Three copies of the port $P_A$ select are fed by the control logic 174 to three drivers 176 to produce a TMR port $P_A$ port select, as indicated in FIG. 13. As noted in FIG. 12, the TMR port $P_A$ port select is fed to the port $P_A$/port $P_B$ chip select sections 169 and to the port $P_A$/port $P_B$ data sections 171, as indicated. In like manner, three copies of the port $P_B$ select produced by the port $P_B$ control section 173B (FIG. 13) are fed to the port $P_A$/port $P_B$ chip select sections 169 and to the port $P_A$/port $P_B$ data sections 171, as indicated in FIG. 12.

Referring again to FIG. 13, the three copies of the port $P_A$ select are fed to a pair of Majority Gates 177, 178. The outputs of the Majority Gates 177, 178 are fed to a first input of AND gates 179, 180, respectively, as shown. The port $P_A$ write enable is fed to the second input of AND gate 179 to produce a port $P_A$ write enable signal on line $W'_A$ and the port $P_A$ read enable is fed to the second input of the AND gate 180 to produce a port $P_A$ read enable signal on line $R'_A$, as shown. It is noted that the port $P_B$ control logic 173B operates in an equivalent manner to produce a port $P_B$ write enable signal on line $W'_B$ and a port $P_B$ read enable signal on line $R'_B$, as indicted. The port $P_A$ write enable signal on line $W'_A$ and the port $P_B$ write enable signal on line $W'_B$ are fed to and OR gate W to produce a write enable signal (W) for the port $P_A$/port $P_B$ data sections, as indicated in FIG. 12. Likewise, the port $P_A$ read enable signal on line $R'_A$ (FIG. 13) and the port $P_B$ read enable signal on line $R'_B$are fed to and OR gate R to produce a read enable signal (R) for the port $P_A$/port $P_B$ data sections, as indicated in FIG. 12. It is noted that the control logic 174 (FIG. 13) produces a port $P_A$ write latch signal when a write enable signal is detected by the control logic 174 and produces a port $P_A$ read latch signal when a read enable signal is detected by the control logic 174. The port $P_A$ read and write latch signals, along with the port $P_B$ read and write latch signals produced by the port $P_B$ control section 173B (FIG. 13) are fed to the port $P_A$ port/$P_B$ data sections 171, as indicated in FIG. 12.

Figure 14:
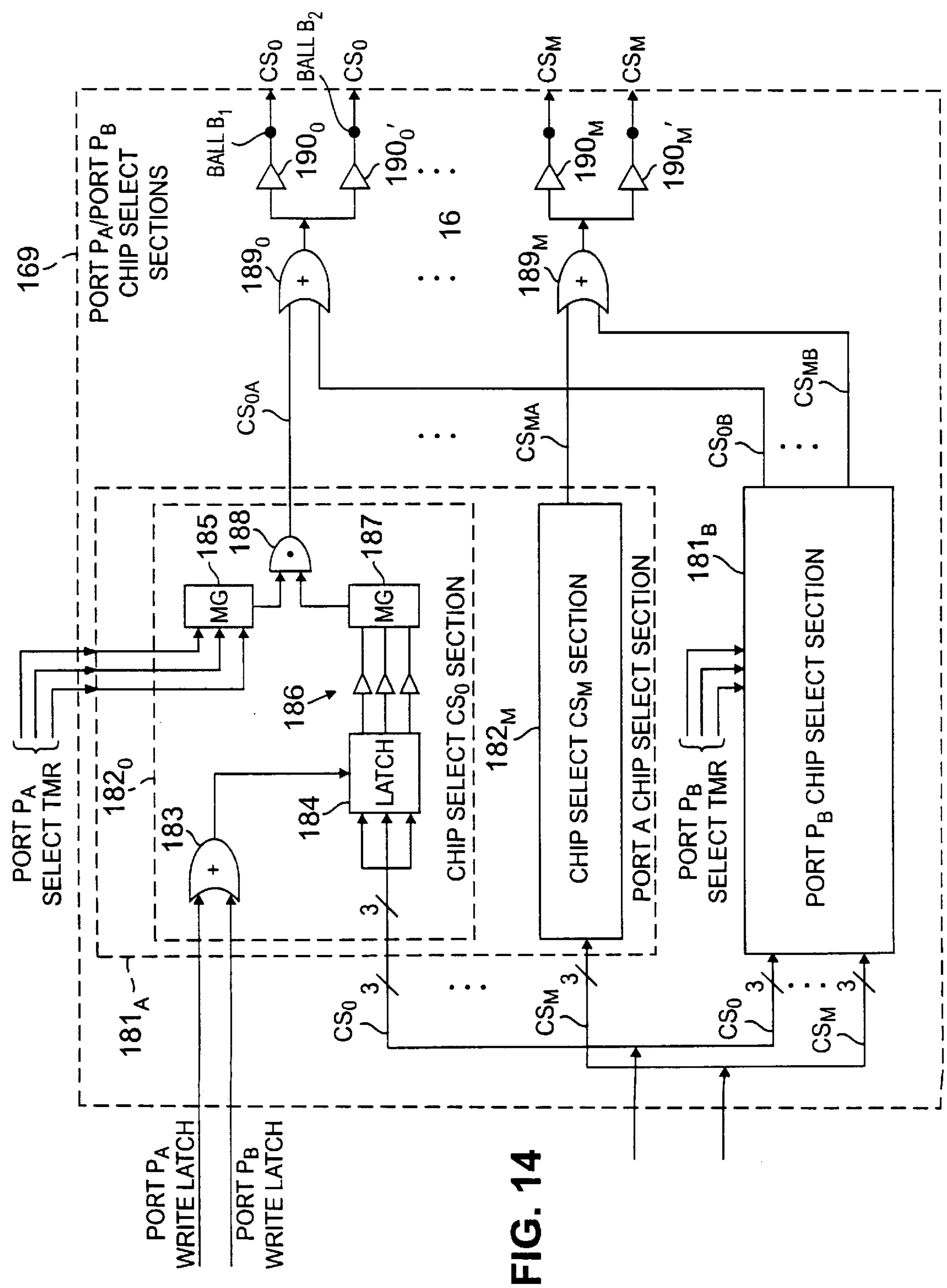
FIG. 14 is a block diagram of port $P_A$/port $P_B$ chip select sections used in the interface section of FIG. 13.

Referring now to FIG. 14, port $P_A$/port $P_B$ chip select sections 169 are shown to include a port $P_A$ chip select section 181A and a port $P_B$ chip select section 181B. The port $P_A$ chip select section 181A and port $P_B$ chip select section 181A are identical in construction, an exemplary one thereof, here port $P_A$ chip select section 181A being shown in detail to include a plurality of, here M+1=8, chip select sections $182_0$–$182_M$, each one thereof being fed by a corresponding set of three copies chip selects $CS_0$–$CS_M$, respectively, as indicated. Further, each one of the chip select sections $182_0$–$182_M$ is fed by the TMR port $P_A$ select signal produced by the port $P_A$ control section 173A (FIG. 13), as indicated. In like manner, three copies chip selects $CS_0$–$CS_M$ and the TMR port $P_B$ select signal produced by the port $P_B$ control section 173B (FIG. 13) are fed to the port $P_B$ chip select section 181B.

Referring in more detail to the chip select section $182_0$, such section $182_0$ includes a latch 184 fed to the three copies of chip select $CS_0$. A latch signal is produced for the latch 184 by the output of an OR gate 183. The OR gate 183 is fed by the port $P_A$ write latch and the port $P_B$ write latch signals produced by the port $P_A$/port $P_B$ control sections 167 (FIG. 12). The chip select section $182_0$ also includes a Majority Gate 185 fed by the TMR port $P_A$ select, a set of three drivers 186 fed by the latch 184, a Majority Gate 187 fed by the drivers 186, and an AND gate 188 fed by the Majority Gates 185, as shown. Thus, if two of the three copies of the port $P_A$ select are the same and two of the three outputs of drivers 186 are the same, a chip select signal $CS_{0A}$ is produced by AND gate 188. In like manner, the port $P_B$ chip select produces a chip select signal $CS_{0B}$. The signals $CS_{0A}$ and $CS_{0B}$ are fed to an OR gate $189_0$. The output of OR gate $189_0$ is fed through drivers $190_0$, $190'_0$, to the pair of electrically connected balls $B_1$, $B_2$, respectively of a ball grid arrayed package 232 shown in FIGS. 11A and 11B. As will be described in detail in connection with FIGS. 11A and 11B, the pair of balls $B_1$, $B_2$ of the ball grid arrayed package 232 (FIGS. 11A and 11B) houses the interface section 166A to produce a pair of redundant chip select signals $CS_0$. Thus, a pair of redundant chip select signals are produced for each of the chip selects $CS_M$ through OR gates $189_M$, drivers $190_M$, $190'_M$, as indicated FIG. 14. In any event, these redundant chip select signals, $CS_0$–$CS_M$ are fed to a corresponding one of the memory banks $160_0$–$160_M$, respectively, as shown in FIG. 6.

Referring now to FIG. 15, port $P_A$/port $P_B$ data sections 171 is shown. The sections 171 are adapted to pass data therethrough bi-directionally between the ASICs (A,A), (A,B), (A,C) and (A,D) and memory region A. Thus, the sections 171 have input/output nibble ports $DN_0$–$D_{NN}$ shown on the left in FIG. 15 and input/output nibble ports $DN_0$–$D_{NN}$ shown on the right in FIG. 15. It is to be noted that each one of the input/output nibble ports $DN_0$–$D_{NN}$ while represented as a single port is here four ports for handling each of the four bits in the nibble handled by such port. Thus, input/output nibble ports $DN_0$–$D_{NN}$ shown on the left in FIG. 15 are coupled to write drivers $193W_0$–$193W_N$, respectively, as shown, and to read drivers $193R_0$–$193R_N$, respectively, as shown. In like manner, input/output nibble ports $DN_0$–$D_{NN}$ shown on the right in FIG. 15 are coupled to write drivers $198W_0$–$198W_N$, respectively, as shown, and to read drivers $198R_0$–$198R_N$, respectively, as shown. The write drivers $193W_0$–$193W_N$ and $198W_0$–$198W_N$ are enabled by the write enable signal (W) produced by the port $P_A$/port $P_B$ control sections 167 (FIG. 13) and the read drivers $193R_0$–$193R_N$ and $198R_0$–$198R_N$ are enabled by the read enable signal (R) produced by the port $P_A$/port $P_B$ control sections 167 (FIG. 13).

The port $P_A$/port $P_B$ data sections 171 (FIG. 15) include a port $P_A$ data section 191A and a port $P_B$ data section 191B, as shown. Each one of the port $P_A$ and port $P_B$ data sections 191A, 191B is identical in construction, an exemplary one thereof, here section 191A being shown in detail to include a write latch 192W, a read latch 192R, and a plurality of, here N+1, nibble data sections $194_{N0}$–$194_{NN}$. The write latch 192W latches therein the data produced by write drivers $193W_0$–$193W_N$ in response to a port $P_A$ write latch signal produced by the control logic 174 (FIG. 13) and the read latch 192R latches therein the data produced by read drivers $193R_0$–$193R_N$ in response to a port $P_A$ read latch signal produced by the control logic 174 (FIG. 13).

It is noted that each one of the nibble data sections $194_{N0}$–$194_{NN}$ is identical in construction. An exemplary one thereof, here nibble data section $174_{N0}$ being shown in detail to include a write Majority Gate 195W and a read Majority Gate 195R, both being fed the TMR port $P_A$ select signals produced by the control logic 174 (FIG. 13). The output of Majority Gate 195W is fed to AND gate 196W (actually four AND gates, one for each bit of nibble $D_{N0}$) along with the nibble $D_{N0}$ latched into write latch 192W. Thus, if two of the three inputs to Majority Gate 195W are the same, the nibble $D_{N0}$ passes through AND gate 196W to one of two inputs of OR gate $197W_0$ (actually four OR gates, one for each bit of nibble $D_{N0}$) along with the corresponding nibble $D_{N0}$ produced by the port $P_B$ data section 191B. The output of OR gate $197W_0$ is fed to write driver $198W_0$, as indicated. Thus, either the nibble $DN_{0A}$ or $DN_{0B}$ will pass through the OR gate $197_0$ because of the mutually exclusive nature of the port A and port B select signals. The output of the OR gate $197W_0$ (i.e., nibble $DN_{0A}$ is coupled though write enabled driver $198W_0$ to the row of DRAMs $162_0$ shown in FIG. 6. Equivalent processing is performed on the rest of the nibbles through $D_{NN}$ with data sections through $194_{NN}$, OR gates through $197_{NN}$ and write drivers $198W_N$.

In reciprocal manner, data at read drivers $198R_0$–$198R_N$ are latched into read latch 192R in response to a port $P_A$ read latch signal produced by control logic 174 (FIG. 13). The data then passes through the AND gate 196R of the data nibble sections through $194_{NN}$, in the manner described above for AND gate 196W. The read data from memory section A then passes through OR gates $195R_0$–$195_N$ (i.e. from either the port $P_A$ or port $P_B$ data sections 191A, 191B to the read drivers $193R_0$–$193R_N$, as indicated.

Referring again to FIGS. 10, 11A and 11B, it is noted that the chip select signal, for example chip select $CS_0$ are produced at two balls $B_1$, $B_2$ of package 232 (as described above in connection with FIG. 14). Each ball $B_1$, $B_2$ passing to a conductor 280 formed on one inner level of the PCB. The conductor 280 is shown along a vertical direction in FIG. 11A. The connection between the balls $B_1$ and $B_2$ is by a pair of redundant conductive vias 282, 284. The redundant vias 282, 284 are interconnected by conductor 280. It is noted that the balls $B_1$, $B_2$ are separated from the balls $B_3$, $B_4$ which carry another chip select signal, e.g., $CS_1$ by un-connected balls $B_D$. That is, each pair of adjacent conductors 280 are electrically isolated from the balls $B_D$. Thus, if there is an inadvertent electrical short between neighboring, i.e., adjacent balls, the chip select signal is not effected because: (1) if the adjacent balls are $B_1$ and $B_2$, there is no fault (i.e., error) because both balls $B_1$ and $B_2$ carry the identical signal, $CS_0$; and, (2) if there is a short between $B_1$ and one of the adjacent balls $B_D$, the is no error because ball $B_D$ is not used by the circuitry (i.e., is electrically isolated from) in the package 232 or is not connected to anything else interconnected by the PCB.

Referring again to FIG. 11A, it is noted that in connecting vertically travelling conductor 280 to a horizontally travelling conductor 290 (which is on a different level of the PCB from that of conductor 280), a pair of redundant conductive vias 292, 294 is used in the common region, R, where the conductors 280, 290 overlay one another. Further, it is noted that each via 292, 294 is connected to the conductor 290 by a section 296 which section forms the leg of a T-shaped connection encircled by the dotted line 300. The use of this T-shaped interconnect is more appreciated when noting that the conductor 290 is connected to a contact pad 302 for a column of DRAMs, one of which is shown in FIG. 11A. This connection is made by conductor 290 being connected to section 304 on the same level as conductor 290. Again a T-shaped connection 300 is made between conductor 290 and section 304, the proximal end of the leg section 304 of the T-shaped connection is formed with, and connected to, the conductor 290 and the distal end of section 304 is connected to a conductive via 306 which passes to the top PCB surface mounting pad 302. The chip select terminal of the DRAMs 162 connected to an exemplary one of the buses, here bus 290 are connected to pads 302. as shown. It is noted that, because of the T-shaped connection 300, if the leg section 304 has an open circuit fault, the conductor 290 will pass the chip select signal $CS_0$ to other DRAMs 162 in the row, also connected to conductor 290.

It is noted that redundant vias are used at points where, if there is a failure, i.e., open circuit fault, the data passing through he via is detectable, but not correctable. That is, redundant vias are not used with data which is correctable thereby reducing the number of vias.

Figure 1:
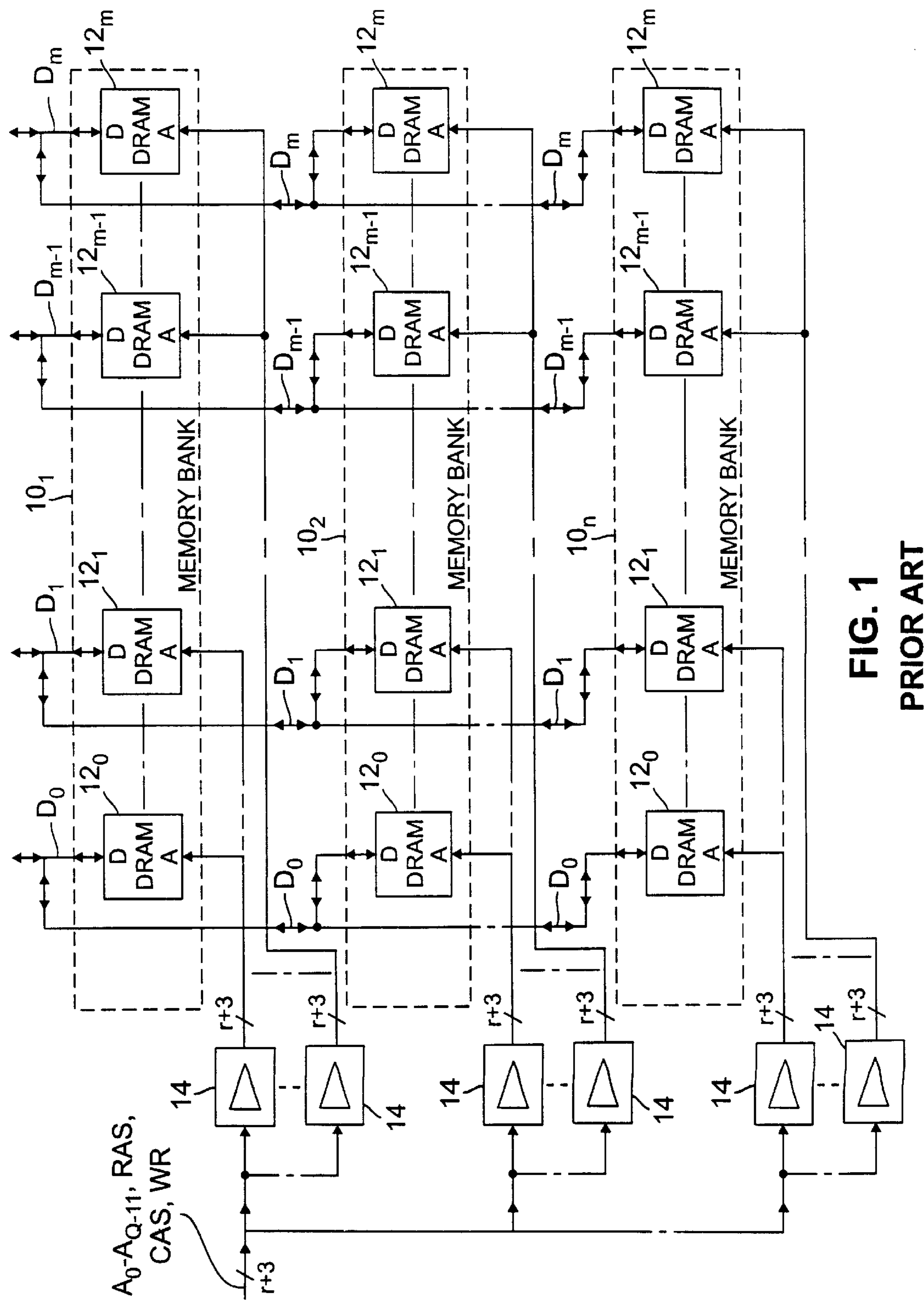
FIG. 1 is a block diagram of a memory system according to the PRIOR ART.
Figure 2:
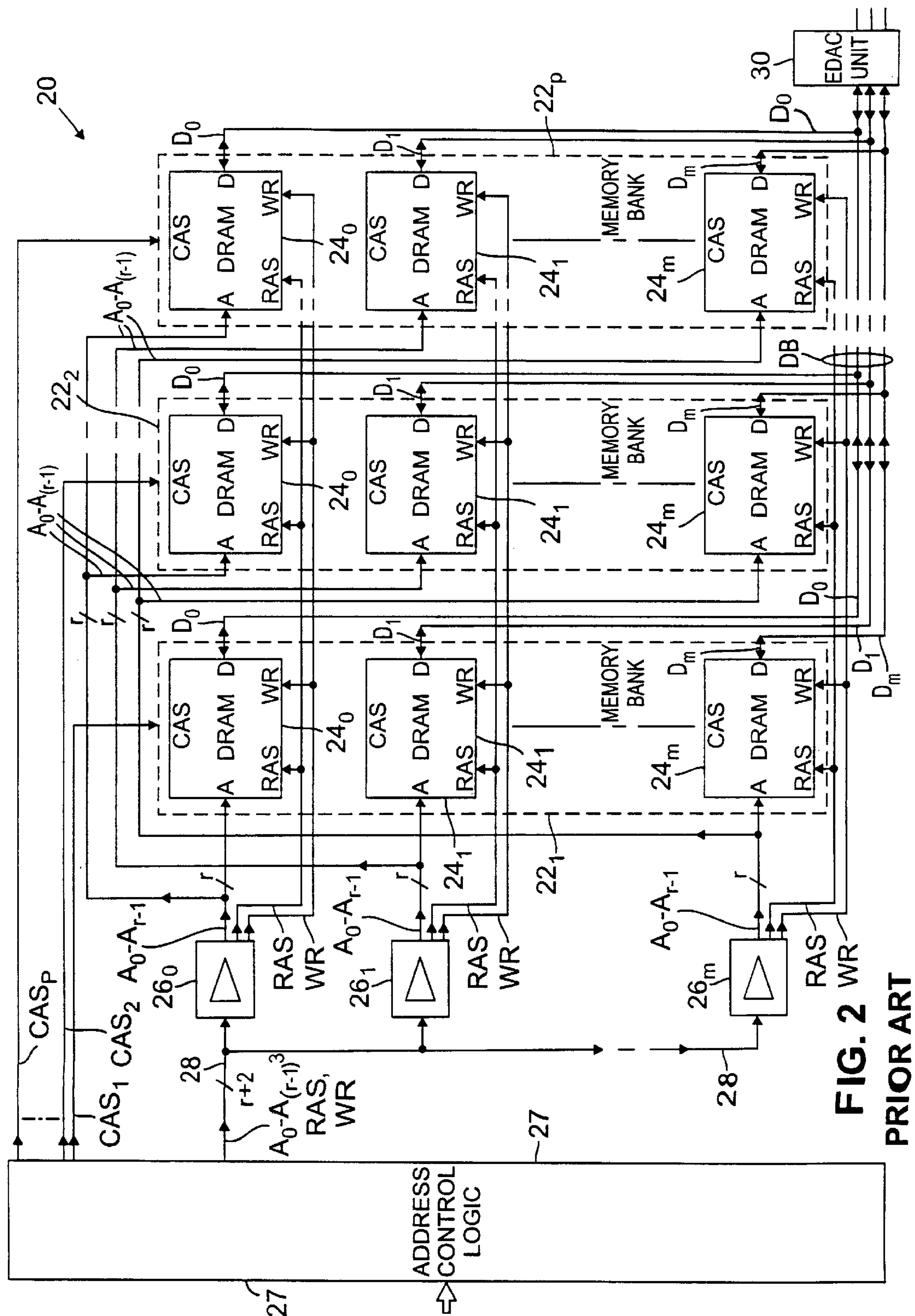
FIG. 2 is a block diagram of another memory system according to the PRIOR ART.

Referring to buffer memory 152, as described in my co-pending patent application entitled "Memory Having Error Correction and Detection", mentioned above, the EDAC 155 includes Single Error Correction Double Error Detection and Single Nibble Correction/Double Nibble Detection (SNCDND) EDAC, here coupled to the DRAMs 162 in memory region A 30 (FIG. 2). As described in such co-pending patent application, the SNCDND receives data with redundant bits from the controller 120, 122. Here, the data is 64 bits and there are 8 redundant bits, i.e., a 72 bit word. The 72 bit word is written into a write FIFO 242, (FIG. 9), in the buffer memory 152. When read from the write FIFO 242, the 72 bit word is passed to the first SNECDED EDAC 250 for correction of a single bit error or detection of a double bit error in the 72 bit word read from the write FIFO 242. The SECDED 250 includes a conventional syndrome 260 fed by the redundant bits, here the 8 redundant bits of the 72 bit word from the write FIFO 242 and the here 64 bits of data in such 72 bit word is fed to a SECDED 262. The output of the syndrome 260 is a m=8 bit word which is fed to a SECDED corrector 264 to thereby generate a 72 bit correction vector. The correction vector produced by the SECDED corrector 264 is fed to an exclusive OR 262 along with the 72 bit word produced at the output of the write FIFO 242. The exclusive OR 250 corrects the 72 bit word produced at the output of the write FIFO 242 with the correction vector produced by the SECDED corrector 264 in accordance with the double bit Hamming code, assuming at most a single bit error in the 64 bit data.

The output of the SECDED EDAC 250 is fed to the SNCDND EDAC 252 which generates a P=16 bit nibble redundant code along with the 72 bits of data produced by the SECDED 250. The N=64 bit portion of the 72 bit word produced by the SNCDND EDAC 252 is encoded by the SNCDND EDAC 252 to enable downstream correction of a single nibble error (i.e., 4 bit error) in the N+P=80 bit word or to enable detection of an error if two nibbles are found to be in error. Thus, the SNCDND 252 generator produces a P=16 bit redundancy code which is stored in an EDC register 270; the 72 bit word produced by a FIFO for storage in a write register 272. Thus, the EDC 270 and write register 272 together store an N+P=80 bit word for storage in the DRAM 162. An equivalent read operation is described in my above referenced patent application for storage or read data in read FIFO 243. Here, a SNCDND EDAC 280 corrects a nibble if there is only one erroneous nibble (i.e., a defect in one of the packages) or will detect the presence of an error if there are two erroneous nibbles (i.e., defects in two of the 4 bit DRAM packages).

Other embodiments are within the spirit and scope of the appended claims.

What is claimed is:

1. A printed circuit board, comprising:

an elongated electrical conductor disposed on the printed circuit board, the electrical conductor having disposed along a length thereof a plurality of laterally displaced legs, each one of the legs having a proximal end extending from an edge of the conductor; and, a plurality of conductive vias passing through the printed circuit board, each one of such vias having one end thereof in contact with a corresponding one of the legs.

2. The printed circuit board recited in claim 1 wherein the legs are disposed perpendicular to the elongated electrical conductor.

3. A printed circuit board, comprising:

an electrical conductor, such electrical conductor having:

a first portion disposed on a first level of the printed circuit board;

a second portion disposed on a different level of the printed circuit board, such first and second portions being disposed along different directions, such first and second conductors being disposed in overlaying relationship in a common region of the printed circuit board;

a plurality of conductive vias passing through the printed circuit board in the common region to electrically interconnect the first and second portions of the electrical conductors.

4. The printed circuit board recited in claim 3 wherein one of the portions of the electrical conductor has a leg with a proximal end extending from an edge of the conductor portion; and, wherein such printed circuit board has a conductive via passing through the printed circuit board, such via having one end thereof in contact with the leg.

5. The printed circuit board recited in claim 4 wherein the leg is disposed perpendicular to the conductor portion.

6. A printed circuit board, comprising:

an array of electrical contact pads disposed on a surface of the printed circuit board and arranged for connection to balls of a ball grid array package, such pads being arranged in rows;

a pair of conductive vias;

a pair of electrical conductors disposed in the printed circuit board, the conductors being electrically connected to corresponding alternating ones of rows of the pads through a corresponding one of the pair of vias; and wherein the contact pads disposed between the alternating ones of the rows are electrically isolated from the pair of electrical conductors.

7. The printed circuit board recited in claim 6 including, for each one of the rows of pads, a plurality of electrically conductive vias, each one thereof being electrically connected to one of the electrical conductors.

8. The printed circuit board recited in claim 6 including, for each one of the rows of pads, a plurality of adjacent electrically conductive vias, each one thereof being electrically connected to one of the electrical conductors.

9. A memory system comprising:

a printed circuit board;

an array of memory units disposed on a surface of the printed circuit board, such memory units being arranged in a matrix of row and columns;

an elongated electrical conductor disposed on an inner portion of the printed circuit board, the electrical conductor having disposed along a length thereof a plurality of laterally displaced legs, each one of the legs having a proximal end extending from the conductor; and, a plurality of conductive vias passing through the printed circuit board, each one of such vias having one end thereof in contact with a corresponding one of the legs and a second end at the surface of the printed circuit board for electrical connection to a corresponding one of the rows of memory units.

10. The memory system recited in claim 9 wherein the electrical conductor has:

a first portion disposed on a first level of the printed circuit board;

a second portion disposed on a different level of the printed circuit board, such first and second portions being disposed along different directions, such first and second conductors being disposed in overlaying relationship in a common region of the printed circuit board;

a plurality of conductive vias passing through the printed circuit board in the common region to electrically interconnect the first and second portions of the electrical conductors.

11. A memory system comprising:

a printed circuit board;

an array of memory units disposed on a surface of the printed circuit board, such memory units being arranged in a matrix of row and columns;

a first pair of elongated electrical conductor disposed on an inner portion of the printed circuit board, each one of the electrical conductors having disposed along a length thereof a plurality of laterally displaced legs, each one of the legs having a proximal end extending from the conductor;

a plurality of conductive vias passing through the printed circuit board, each one of such vias having one end thereof in contact with a one of the legs and a second end at the surface of the printed circuit board for electrical connection to a corresponding one of the rows of memory units;

an array of electrical contact pads disposed on a surface of the printed circuit board and arranged for connection to balls of a ball grid array package, such pads being arranged in rows;

a pair of second conductive vias;

a second pair of the electrical conductors electrically connected to corresponding alternating ones of rows of the pads through a corresponding one of the pair of second conductive vias, each one the conductors in the second pair thereof being electrically connected to a corresponding one of the conductors in the first pair thereof; and wherein the contact pads disposed between the alternating ones of the rows are electrically isolated from said pair of electrical conductors.

12. The printed circuit board recited in claim 11 including, for each one of the rows of pads, a plurality of electrically conductive vias, each one thereof being electrically connected to a corresponding one of the second pair of electrical conductors.

13. The printed circuit board recited in claim 11 including, for each one of the rows of pads, a plurality of adjacent electrically conductive vias, each one thereof being electrically connected to a corresponding one of said electrical conductors.

* * * * *